(12) United States Patent
Kee et al.

(10) Patent No.: US 7,756,491 B2
(45) Date of Patent: Jul. 13, 2010

(54) PHASE SHIFTER

(75) Inventors: Scott D. Kee, Dana Point, CA (US);
Ichiro Aoki, San Clemente, CA (US);
Weifeng Feng, Brea, CA (US)

(73) Assignee: Axiom Microdevices, Inc., Irvine, CA (US)

( * ) Notice: Subject to any disclaimer, the term of this patent is extended or adjusted under 35 U.S.C. 154(b) by 189 days.

(21) Appl. No.: 11/771,074

(22) Filed: Jun. 29, 2007

(65) Prior Publication Data
US 2008/0032639 A1 Feb. 7, 2008

Related U.S. Application Data

(60) Provisional application No. 60/835,739, filed on Aug. 4, 2006.

(51) Int. Cl.
*H04B 1/04* (2006.01)
(52) U.S. Cl. .................... 455/114.3; 455/127.2
(58) Field of Classification Search ............ 455/91, 455/108, 110, 114.2, 114.3, 115.1, 124, 126, 455/127.1, 127.2
See application file for complete search history.

(56) References Cited

U.S. PATENT DOCUMENTS

| | | | |
|---|---|---|---|
| 5,396,521 A | | 3/1995 | Minami |
| 5,430,416 A | * | 7/1995 | Black et al. ................ 332/145 |
| 6,650,875 B1 | * | 11/2003 | Rozenblit et al. ............ 455/91 |
| 6,906,601 B2 | * | 6/2005 | Fayyaz ...................... 333/156 |
| 6,950,485 B2 | | 9/2005 | Richards et al. |
| 7,062,233 B2 | * | 6/2006 | Huttunen ................ 455/114.3 |
| 2003/0073419 A1 | * | 4/2003 | Chadwick ................... 455/126 |
| 2007/0298734 A1 | * | 12/2007 | Woo et al. ................ 455/114.3 |

* cited by examiner

*Primary Examiner*—Blane J Jackson

(57) ABSTRACT

A phase shifter includes a plurality of variable gain elements, each variable gain element configured to receive one of a plurality of input signals, each input signal having a phase that is shifted with respect to each other input signal; and a control signal supplied to each variable gain element, where the control signals define a phase shift.

20 Claims, 11 Drawing Sheets

PHASE SHIFTER

CROSS REFERENCE TO RELATED APPLICATION

This application claims priority to co-pending U.S. provisional application entitled, "A Robust, Low Delay, Replica Linearized Power Amplifier Implementation Using Corrective Feedback For Amplitude and Phase Control," having Ser. No. 60/835,739, filed on Aug. 4 2006, and which is entirely incorporated herein by reference. This application is also related to co-pending, commonly assigned U.S. patent application entitled "System and Method For Low Delay Corrective Feedback Power Amplifier Control" having Ser. No. 11/771,130 filed on even date herewith; and co-pending, commonly assigned U.S. patent application entitled "Replica Linearized Power Amplifier" having Ser. No. 11/771,156 filed on even date herewith.

BACKGROUND

Portable communication devices such as cellular-type telephones or other communication devices are becoming more widespread. A portable communication device includes one or more power amplifiers for amplifying the power of the signal to be transmitted from the portable communication device.

With the decreasing size of portable communication devices, power efficiency is one of the most important design criteria. Reducing power consumption prolongs power source life and extends stand-by and talk time of the portable communication device.

A portable communication device may employ a constant or a non-constant envelope modulation methodology. A non-constant envelope modulation scheme is typically implemented with a linear power amplifier. The entire amplitude and phase modulated waveform is provided to the input of the power amplifier and the power amplifier amplifies the combined signal. In a non-constant envelope modulation scheme, "power control" can be implemented as a "slow loop" regulating the gain of the power amplifier or adjusting the input amplitude to compensate for gain variation in the power amplifier that occurs due to process and temperature variations. Unfortunately, a linear power amplifier is significantly less efficient than a nonlinear power amplifier and, as such, consumes more power.

In the case where both a constant envelope modulation methodology and a non-constant envelope modulation methodology are employed, such as in a communication device that operates using the Global System for Mobile Communication (GSM) and the Enhanced Data Rates for GSM Evolution (EDGE) communication formats, the same power amplifier should be used for both signals. The GSM system provides a slightly higher output power and uses a constant-envelope modulation methodology. The EDGE system uses a non-constant-envelope modulation methodology. If a linear power amplifier is used to implement EDGE, then the power amplifier is less efficient when operated in GSM mode. This is why it is desirable to find a way to make a non-linear power amplifier work in EDGE mode.

Polar modulation is a known technique of performing non-constant envelope modulation using a nonlinear power amplifier. In polar modulation, a phase modulated input signal is applied to the radio frequency (RF) input to the power amplifier. The output power of the power amplifier is adjusted at the rate of the amplitude modulation to recompose the modulated waveform at the output of the power amplifier.

A GSM system has traditionally been implemented using a nonlinear power amplifier, with the "power control" implemented as a (slow) gain modulation in the power amplifier. A "power control" signal is supplied to the power amplifier from the baseband subsystem to implement the time-slotting (ramp up power at the beginning of the time slot, ramp it down at the end) of the communication protocol using this slow gain modulation. One prior attempt at implementing a power amplifier in the EDGE system using polar modulation increases the performance of the "power control" signal, so that the power amplifier output power can be changed rapidly to create the modulation and to create the power control (i.e. there is still the slow ramp up and ramp down at the edges of the slot, but the faster modulation is also added in the middle). In this manner, the power amplifier can still be used in GSM mode by applying a signal to the "power control" port with only the ramping signals, while also performing polar modulation in EDGE mode.

There are two kinds of polar modulation: open-loop and closed-loop. In open loop, there is no feedback path for the power amplifier output. In closed-loop, feedback on the amplitude and phase paths is used to measure the output amplitude and phase. The measured amplitude and phase are compared to a desired signal, and then an amplitude and gain correcting mechanism is used to minimize any discrepancy. Such an implementation is difficult while maintaining a very wide bandwidth, meeting noise requirements and preventing the system from becoming unstable and oscillating under output mismatch, for example, in the presence of a voltage standing wave ratio (VSWR).

In such a system, the phase modulation is typically applied directly to the signal input of the power amplifier. The phase can be controlled using a phase correction feedback loop.

One of the challenges when implementing a so called "polar modulation" technique is that the input to output phase relationship of the power amplifier can vary as the output power is changed to produce the amplitude modulation. This can induce phase error in the output signal, where the phase error is modulated with the amplitude modulation. This phase error can be reduced by using a phase correction feedback loop. One implementation of a phase correction feedback loop can use a phase shifter between the desired phase modulated signal and the signal input of the power amplifier, so that the phase shifter phase delay can be dynamically changed to compensate dynamically changing phase delays in the power amplifier.

In some other instances it is also desirable to alter the phase of an RF signal. Many high frequency RF applications use a controllable phase shifter. For example, such a phase shifter can be used in a phase modulator, phase shifting for the elements of a phased-array, and for phase correction loops such as when used with a phase detector and a feedback loop.

For many such applications, it is desirable that the amount of phase shift be continuously adjustable over a given range rater than in discrete steps. It is also often desirable that the amount of phase shift can be controlled over a wide range, possibly even more than 360 degrees. For instance, in a phase-correction feedback loop, large continuous phase shift range can allow the feedback loop to smoothly correct a large amount of power amplifier phase delay variation.

In many applications, it is also desirable that the amount of phase shift be controlled to be a linear function of the adjustment. For example, if the phase shift is adjusted using a control voltage, it is desirable that the amount of phase shift be approximately proportional to the control voltage (or proportional to the control voltage with an offset) so that the slope of the phase shift can be approximately constant across the control range. For instance, in a phase-correction feedback loop, the loop gain can be related to the slope of the phase shifter, so that changes in the phase shifter slope may adversely affect the behavior of the loop, such as by causing instability or reducing the effectiveness of the correction as the slope changes.

FIG. 1 is a schematic diagram of a prior art continuously-variable phase shifter 100 using a variable capacitor to adjust the phase shift. The phase shifter 100 uses a resistor 101 and a variable capacitor 102 connected so that the pole frequency of the transfer function from the input to the output can be modified by changing the capacitance value. The example in FIG. 1 depicts a resistor 101 connected in series with the signal path and a variable capacitor 102 connected in parallel with the output connection. However, other configurations can be used, such as having the capacitor 102 in series with the signal path and the resistor 101 in parallel with the output connection.

The variable capacitor 102 can be implemented using various methods. For example, a metal-oxide-semiconductor field effect transistor (MOSFET) capacitance, such as the gate capacitance of a MOSFET, can be used. A junction capacitor, such as a junction varactor can also be used. Other capacitances, such as micro-electro-mechanical system (MEMS) capacitors or mechanically tunable air-gap capacitors may also be used, so long as the capacitance value is continuously adjustable over a range.

The phase shifter 100 is widely used, but suffers from several limitations. The range of possible phase shift using such a circuit is limited to less than 90 degrees, which may be insufficient in many applications. Additionally, the amplitude of the output signal changes significantly with the phase shift. This amplitude change is unacceptable in many applications. For example, in the phase shifter 100, the input voltage and output voltage have nearly the same amplitude and phase when the capacitor 102 is set to a small value. However, as the capacitance is increased, the output voltage amplitude begins to drop as the phase delay increases. When the phase delay approaches 90 degrees, the output amplitude can be nearly zero.

The phase response of the phase shifter 100 can also be very nonlinear. For example, the phase shifter 100 typically has a phase shift of $-\text{atan}(2*\text{pi}*R*C)$. Using a typical variable capacitor, such as a MOSFET capacitor or a junction varactor, the resulting phase shift response versus the control voltage can be very nonlinear.

FIG. 2 is a schematic diagram of a prior art continuously-variable phase shifter 200 using a variable resistor to adjust the phase shift. The phase shifter 200 uses a variable resistor 201 and a capacitor 202 connected so that the pole frequency of the transfer function from the input to the output can be modified by changing the resistance value. The example in FIG. 2 depicts a variable resistor 201 connected in series with the signal path and a capacitor 202 connected in parallel with the output. However, other configurations can be used, such as having the capacitor 202 connected in series with the signal path and the variable resistor 201 connected in parallel with the output.

The variable resistor 201 can be implemented using various methods. For example, a MOSFET can be used in the triode region such that the resistance value can be adjusted by changing the gate voltage of the MOSFET. Other resistor implementations may also be used, so long as the resistance value is continuously adjustable over a range.

The phase shifter 200 is widely used, but suffers from similar limitations as the variable capacitance phase shifter. The range of possible phase shift using such a circuit is limited to less than 90 degrees. Additionally, the amplitude of the output signal changes significantly with the phase shift, becoming nearly zero at one side of its phase shift range. The phase response versus resistance is similar to the phase shifter 100, typically being very nonlinear using typical variable resistances such as FETs.

FIG. 3 is a schematic diagram of a prior art continuously-variable multi-stage phase shifter 300. The phase shifter 300 uses variable resistors 301, 303 and 305 and capacitors 302, 304 and 306. The variable resistors 301, 303 and 305 and the capacitors 302, 304 and 306 are arranged so that adjusting the resistance values modifies the pole frequencies of the phase shifter 300, resulting in phase shift. Alternately, variable capacitances can be used instead of (or in addition to) variable resistors.

The phase shifter 300, by using several stages of components can potentially increase the range of possible phase shifts. For instance, the three stage circuit depicted can potentially produce a phase shift range of up to 270 degrees if the component values are selected properly. Unfortunately, the amplitude can vary over the range of phase shift, and the phase response can be very nonlinear. Additionally, the noise generated by the phase shifter 300 can be high due to the use of several resistors and signal attenuation.

FIG. 4 is a schematic diagram of a prior art continuously-variable multi-stage inductive-capacitive (LC) phase shifter 400. The phase shifter 400 uses inductors 401, 403 and 405 and capacitors 402, 404 and 406. The inductors 401, 403 and 405 and variable capacitors 402, 404 and 406 are arranged so that adjusting the capacitance values modifies the pole frequencies of the phase shifter 400, resulting in phase shift.

The phase shifter 400, by using several stages of components can also potentially increase the range of possible phase shift. For example, the three stage phase shifter 400 can potentially produce a phase shift range of up to 540 degrees if the component values are selected properly. The amplitude also can vary considerably over the control voltage, but due to the use of inductors instead of resistors, the phase shifter 400 can resemble a synthetic transmission line over a wide range of capacitance values and can have reasonably constant output amplitude over this range. Additionally, since the circuit uses no resistors, the noise induced by the phase shifter 400 can be quite low. Unfortunately, the phase shift can be very nonlinear over the control range, and the use of several inductors can be prohibitive for use in integrated circuit implementations, where resistors and capacitors typically consume less area.

Another prior art adjustable phase shifter generates several, typically two, fixed phase shifts using passive circuits including inductors and capacitors. These signals are added together in various proportions to produce phase shifted outputs as weighted vector averages of the fixed phase input signals. This prior art phase shifter also includes a circuit to set the gains of such a phase shifter having two paths, which can generate around 90 degrees of phase shift with reasonably constant amplitude output.

The prior art phase shifter uses independent LC ladder circuits to generate each phase shift. As such, it can be subject to errors and variation in each of the independent phase shifts due to component variation, resulting in unwanted slope variation in the phase shift response. Additionally, the use of several inductors can increase size and cost, particularly if the phase shifts are fabricated on an integrated circuit. Furthermore, although such a system using these phase shifters is capable of a system range of 180 degrees, it only discloses phase shifters capable of 90 degrees of range. The gain of each of the individual paths in this system can be difficult to control because the system exhibits gain as a function of transistor parameters as well as inductor values. This may cause unwanted variation in phase slope and output amplitude across the phase range if not carefully managed.

Therefore, it is desirable to have a phase shifter which can have larger than 90 degrees of control range with repeatable linear phase control gain and approximately constant amplitude which can be implemented in a compact integrated circuit.

SUMMARY

Embodiments of a circuit include a phase shifter having a plurality of variable gain elements, each variable gain element configured to receive one of a plurality of input signals, each input signal having a phase that is shifted with respect to each other input signal; and a control signal supplied to each variable gain element, where the control signals define a phase shift.

Related embodiments and methods of operation are also provided. Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to application in a portable transceiver, the phase shifter can be implemented in any device in which it is desirable to have a highly controllable phase shift of greater than 90 degrees.

The phase shifter can be implemented in hardware, software, or a combination of hardware and software. When implemented in hardware, the phase shifter can be implemented using specialized hardware elements and logic. When the phase shifter is implemented at least partially in software, the software portion can be used to control components in the phase shifter so that various operating aspects can be software-controlled. The software can be stored in a memory and executed by a suitable instruction execution system (microprocessor). The hardware implementation of the phase shifter can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the phase shifter comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
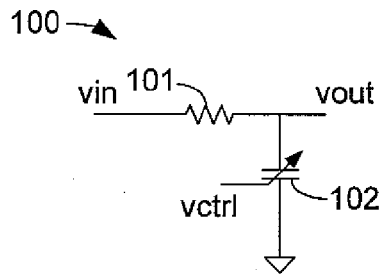
FIG. 1 is a schematic diagram of a prior art continuously-variable phase shifter using a variable capacitor to adjust the phase shift.
Figure 2:
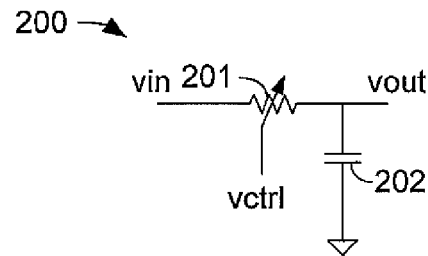
FIG. 2 is a schematic diagram of a prior art continuously-variable phase shifter using a variable resistor to adjust the phase shift.
Figure 3:
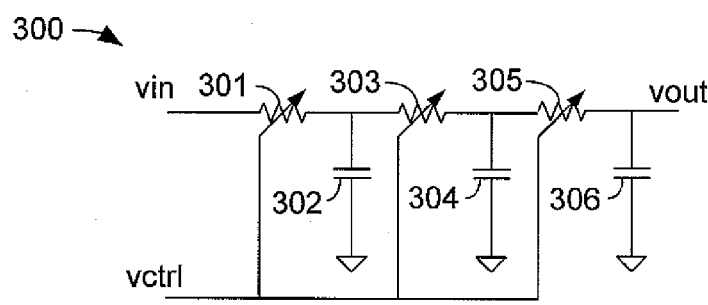
FIG. 3 is a schematic diagram of a prior art continuously-variable multi-stage phase shifter.
Figure 4:
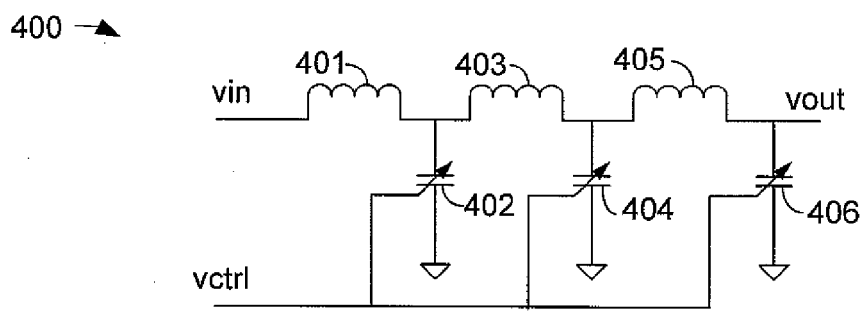
FIG. 4 is a schematic diagram of a prior art continuously-variable multi-stage inductive-capacitive (LC) phase shifter.
Figure 5:
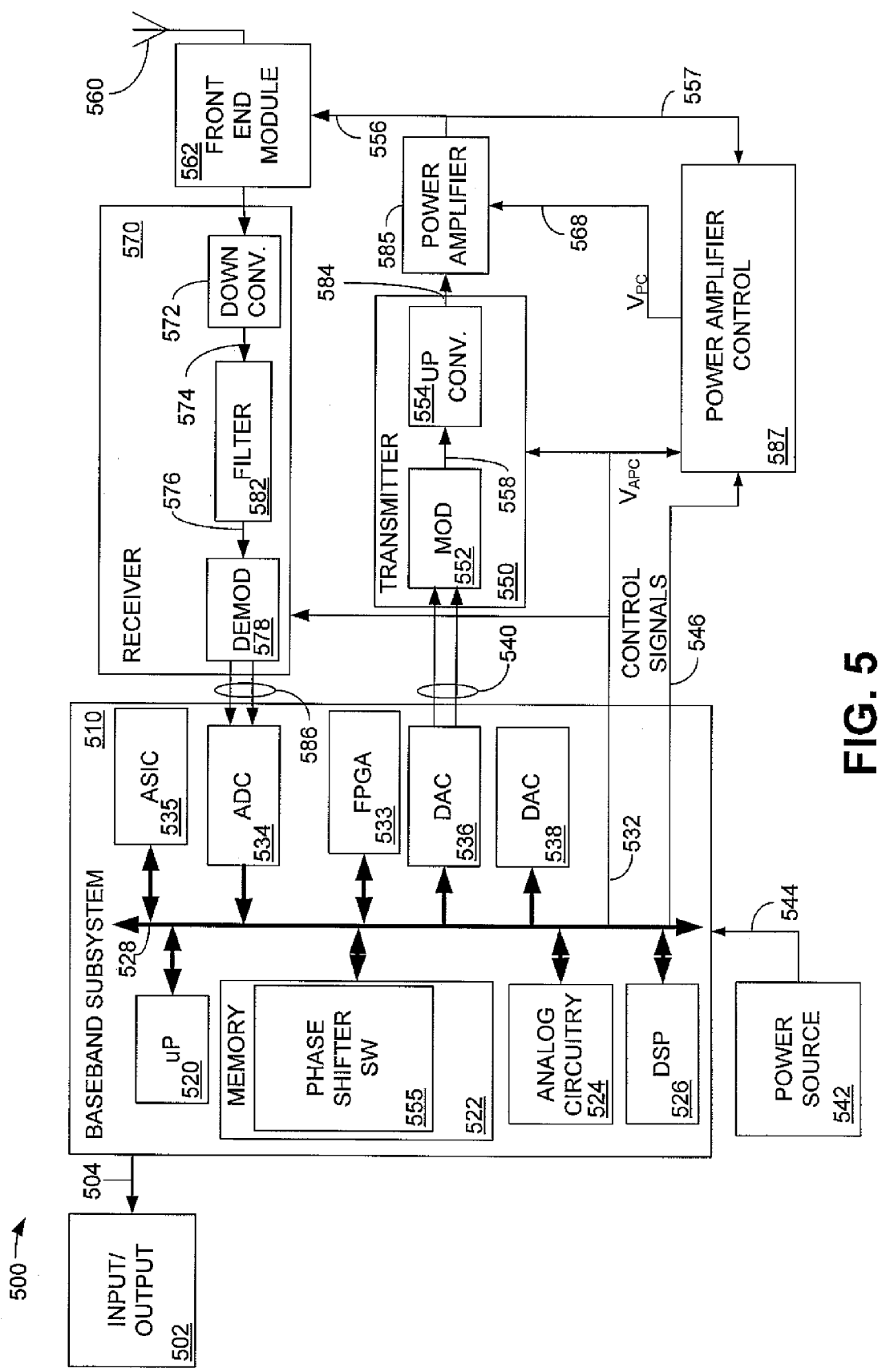
FIG. 5 is a block diagram illustrating a simplified portable transceiver including an embodiment of a phase shifter.

FIG. 5 is a block diagram illustrating a simplified portable transceiver 500 including an embodiment of a low distortion RF limiter. The portable transceiver 500 includes an input/output (I/O) module 502. Depending on the type of portable transceiver, the input/output module 502 may include a speaker, a display, a keyboard, a microphone, a trackball, a touch pad, or any other user interface device. A power source 542, which may be a direct current (DC) battery or other power source, is also connected to the baseband subsystem 510 via connection 544 to provide power to the portable transceiver 500. In a particular embodiment, portable transceiver 500 can be, for example but not limited to, a portable telecommunication device such as a mobile cellular-type telephone. The power source 542 might be connected directly to other parts of the transceiver as well, for example the receiver 570, the transmitter 550, and/or the power amplifier 585.

The baseband subsystem 510 includes a microprocessor (PP) 520, a memory 522, analog circuitry 524, and digital signal processor (DSP) 526 in communication via bus 528. Bus 528, although shown as a single bus, may be implemented using multiple busses connected to provide a physical connection and a logical connection among the subsystems within baseband subsystem 510.

Depending on the manner in which the low distortion RF limiter is implemented, the baseband subsystem 510 may also include one or more of an application specific integrated circuit (ASIC) 535 and a field programmable gate array (FPGA) 533.

Microprocessor 520 and memory 522 provide the signal timing, processing and storage functions for portable transceiver 500. Analog circuitry 524 provides the analog processing functions for the signals within baseband subsystem 510. Baseband subsystem 510 provides control signals to transmitter 550, receiver 570 power amplifier 585 and the power amplifier control element 587 such as through connection 532 for example.

The baseband subsystem 510 generates a power control signal that includes an amplitude-modulation (AM) component and provides the AM signal on connection 546 to the power amplifier control element 587. In practice, the functions of generating the power control signal and the AM signal can alternatively be integrated within other parts of the transceiver as well, for example in the transmitter 550 or in the power amplifier control element 587. The power control signal can be referred to as $V_{APC}$. The power control signal, $V_{APC}$, can be generated by the baseband subsystem 510 and is converted to an analog control signal by the digital-to-analog converter (DAC) 538. The power control signal, $V_{APC}$, is illustrated as being supplied from the bus 528 to indicate that the signal may be generated in different ways as known to those skilled in the art. The power control signal, $V_{APC}$, is a reference voltage signal that defines the transmit power level and provides the power profile. Generally, the power control signal, $V_{APC}$ controls the power amplifier as a function of the peak voltage of the power amplifier determined during calibration, and corresponds to power amplifier output power. In some embodiments the power control signal might be in the form of a current or a digital signal rather than an analog voltage.

The control signals on connections 532 and 546 may originate from the DSP 526, the ASIC 535, the FPGA 533, or from microprocessor 520, and are supplied to a variety of connections within the transmitter 550, receiver 570, power amplifier 585, and the power amplifier control element 587. It should be noted that, for simplicity, only the basic components of the portable transceiver 500 are illustrated herein. The control signals provided by the baseband subsystem 510 control the various components within the portable transceiver 500. Further, the function of the transmitter 550 and the receiver 570 may be integrated into a transceiver.

If portions of the phase shifter are implemented in software that is executed by the microprocessor 520, the memory 522 will also include phase shifter software 555. The phase shifter software 555 comprises one or more executable code segments that can be stored in the memory and executed in the microprocessor 520. Alternatively, the functionality of the phase shifter software 555 can be coded into the ASIC 535 or can be executed by the FPGA 533, or another device. Because the memory 522 can be rewritable and because the FPGA 533 is reprogrammable, updates to the corrective feedback power control software 555 can be remotely sent to and saved in the portable transceiver 500 when implemented using either of these methodologies.

Baseband subsystem 510 also includes analog-to-digital converter (ADC) 534 and digital-to-analog converters (DACs) 536 and 538. In this example, the DAC 536 generates the in-phase (I) and quadrature-phase (Q) signals 540 that are applied to the modulator 552. Other embodiments are possible, for example by utilizing direct modulation of a phase locked loop (PLL) synthesizer or direct digital synthesizer (DDS). These methods are well-know to those skilled in the art. In this example the DAC 538 generates the power control signal, $V_{APC}$, on connection 546. ADC 534, DAC 536 and DAC 538 also communicate with microprocessor 520, memory 522, analog circuitry 524, DSP 526 and FPGA 533 via bus 528. DAC 536 converts the digital communication information within baseband subsystem 510 into an analog signal for transmission to a modulator 552 via connection 540. Connection 540, while shown as two directed arrows, includes the information that is to be transmitted by the transmitter 550 after conversion from the digital domain to the analog domain.

The transmitter 550 includes modulator 552, which modulates the analog or digital information on connection 540 and provides a modulated signal via connection 558 to upconverter 554. The upconverter 554 transforms the modulated signal on connection 558 to an appropriate transmit frequency and provides the up converted signal to a power amplifier 585 via connection 584. In alternative embodiments, the modulator 552 and the upconverter 554 can be combined into a single element that provides both functions simultaneously. The power amplifier 585 amplifies the signal to an appropriate power level for the system in which the portable transceiver 500 is designed to operate.

Details of the modulator 552 and the upconverter 554 have been omitted, as they will be understood by those skilled in the art. For example, the data on connection 540 is generally formatted by the baseband subsystem 510 into in-phase (I) and quadrature (Q) components. The I and Q components may take different forms and be formatted differently depending upon the communication standard being employed. For example, when the power amplifier 585 is used in a constant-amplitude, phase (or frequency) modulation application such as the global system for mobile communications (GSM), the phase modulated information is provided by the modulator 552. When the power amplifier 585 is used in an application requiring both phase and amplitude modulation such as, for example, extended data rates for GSM evolution, referred to as EDGE, the Cartesian in-phase (I) and quadrature (Q) components of the transmit signal are converted to their polar counterparts, amplitude and phase. The phase modulation is performed by the modulator 552, while the amplitude modulation is performed by the power amplifier control element 587, where the amplitude envelope is defined by the PA power control voltage $V_{PC}$, which is generated by the power amplifier control element 587. This technique is known as polar modulation.

The power amplifier 585 supplies the amplified signal via connection 556 to a front end module 562. The front end module 562 comprises an antenna system interface that may include, for example, a diplexer having a filter pair that allows simultaneous passage of both transmit signals and receive signals, as known to those having ordinary skill in the art. The transmit signal is supplied from the front end module 562 to the antenna 560.

A signal received by antenna 560 will be directed from the front end module 562 to the receiver 570. The receiver 570 includes a downconverter 572, a filter 582, and a demodulator 578. If implemented using a direct conversion receiver (DCR), the downconverter 572 converts the received signal from an RF level to a signal centered around baseband frequency (DC), or a near-baseband frequency (~100 kHz). Alternatively, the received RF signal may be downconverted to an intermediate frequency (IF) signal, depending on the application. The downconverted signal is sent to the filter 582 via connection 574. The filter comprises a least one filter stage to filter the received downconverted signal as known in the art.

The filtered signal is sent from the filter 582 via connection 576 to the demodulator 578. The demodulator 578 recovers the transmitted analog information and supplies a signal representing this information via connection 586 to ADC 534, ADC 534 converts these analog signals to a digital signal at baseband frequency and transfers the signal via bus 528 to DSP 526 for further processing.

Figure 6:
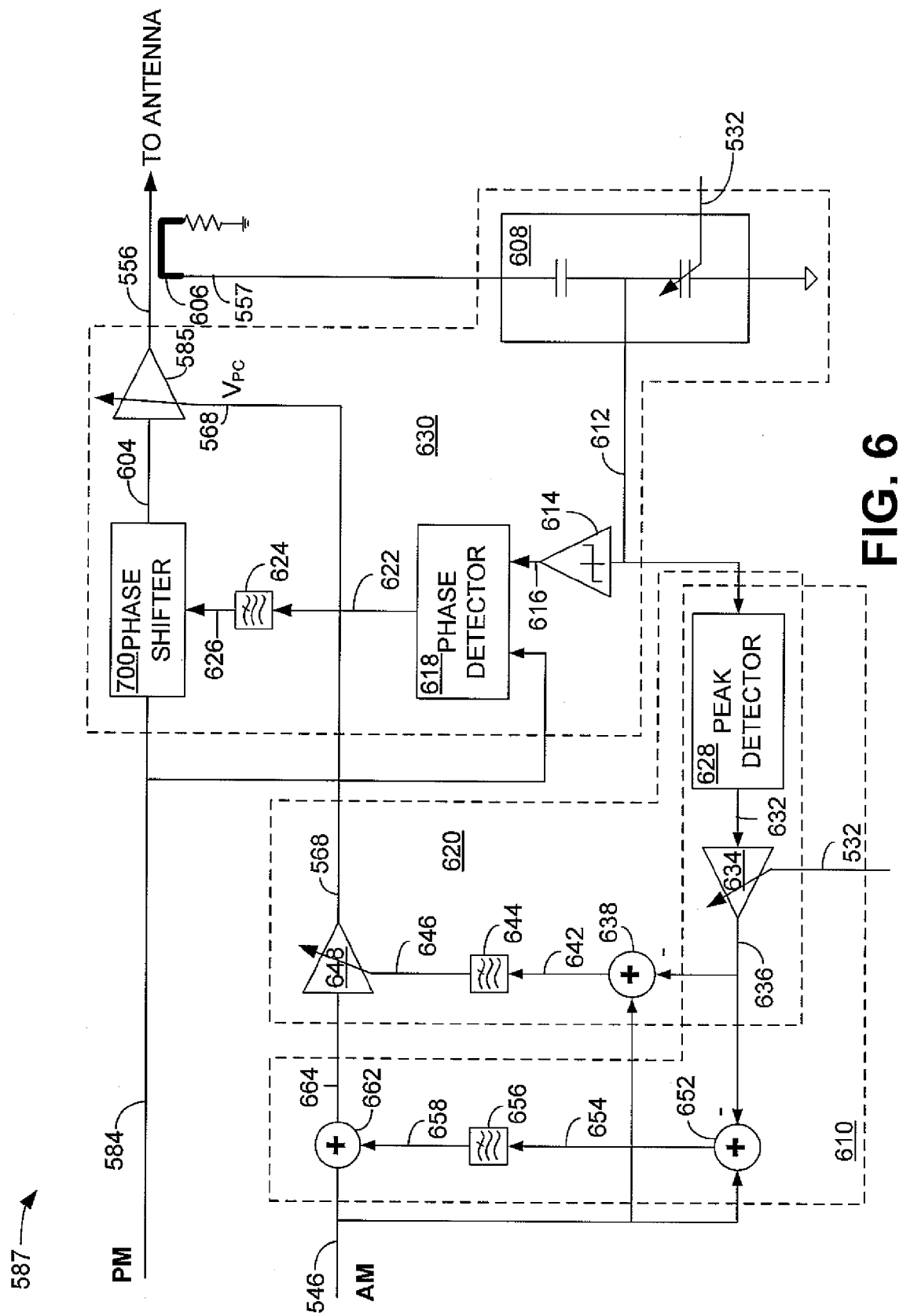
FIG. 6 is a block diagram illustrating an embodiment of the power amplifier control element of FIG. 5 including an embodiment of a phase shifter.

FIG. 6 is a block diagram illustrating an embodiment of the power amplifier control element 587 of FIG. 5. The power amplifier control element 587 controls the power output of the power amplifier 585, which receives a phase modulated (PM) signal via connection 584 and an amplitude modulation (AM) control signal via connection 546. In this embodiment, the AM and PM signals are independently controlled and are combined in the power amplifier circuitry. The AM signal on connection 546 is provided via the baseband subsystem 510 (FIG. 5) and is used as a control signal which impresses the AM on the control port of the power amplifier 585. The AM signal is used to control the power output of the power amplifier 585. The PM signal on connection 584 is a signal comprising a low-frequency phase modulation of the radio frequency RF carrier supplied to the RF input of the power amplifier 585. The signal on connection 584 may be provided as a pair of correlated quadrature signals sin(ωt+phase modulation) and cos(ωt+phase modulation), as a single ended signal, as a differential signal, or in other suitable manners.

However, applying the amplitude modulation to the control port of the power amplifier 585 can distort the phase portion of the signal through the power amplifier 585, such as if the phase delay of the power amplifier 585 changes with the control signal or the output level. Additionally, the output amplitude can be distorted relative to the desired output amplitude if the output amplitude of the power amplifier 585 does not accurately track the control signal 568. To minimize these phase and amplitude distortions, the power amplifier control element 587 comprises a phase correction loop (phase loop) 630 in addition to an outer AM correction loop (outer AM loop) 610 and an inner AM correction loop (inner AM loop) 620. The inner and outer AM correction loops improve the linearity of the AM control of the power amplifier 585. The bandwidth of the outer AM correction loop 610 is larger than the bandwidth of the inner AM correction loop 620 by an approximate magnitude of 10. In an example using the EDGE modulation spectrum, the bandwidth of the outer AM correction loop 610 is approximately 2 megahertz MHz) and the bandwidth of the inner AM correction loop 620 is approximately 200 kilohertz (kHz). The bandwidth of the phase correction loop 630 is approximately 2 MHz. The approximate decade difference between the outer AM correction loop 610 and the inner AM correction loop 620 helps to maintain the stability of the power amplifier control element 587.

In an embodiment, the power amplifier 585 is implemented using a power amplifier device having a linearized control circuit and methodology, which linearizes the amplitude control characteristic of the power amplifier 585. This power amplifier is also referred to as a "replica-corrected power amplifier."

In an embodiment, the power amplifier 585, the outer AM correction loop 610, the inner AM correction loop 620 and the phase correction loop 630 are implemented on the same semiconductor die. In this manner, the response of the components is similar with respect to process and temperature variations.

A portion of the output of the power amplifier 585 on connection 556 is coupled by using, for example, an RF coupler 606 to connection 557. Alternately, other couplings can be used, such as a direct connection, capacitive division, voltage sense, current sense, or other couplings or combinations of couplings. The RF signal on connection 557 is provided to a variable attenuator 608. The variable attenuator 608 is controlled by a signal from the baseband subsystem 510 via connection 532. The control signal on connection 532 controls the amount of attenuation provided by the variable attenuator 608. The output of the variable attenuator 608 is provided via connection 612.

The outer AM correction loop 610 comprises a peak detector 628, a baseband variable gain amplifier (VGA) 634, an adder 652, a low pass filter 656 and an adder 662. The output of the variable attenuator on connection 612 is coupled to the peak detector 628. The peak detector 628 removes the RF portion of the signal from connection 612 and provides via connection 632 to the baseband VGA 634 a baseband signal that is proportional to the AM envelope of the RF signal on connection 612. The baseband VGA 634 is controlled by a signal via connection 532 from the baseband subsystem 510. The baseband VGA 634 adjusts the gain of the signal at connection 632 and provides an output via connection 636. The output of the baseband VGA 634 on connection 636 is provided to an adder 652. Another input to the adder 652 is the AM control signal on connection 546. The signal on connection 636 is subtracted from the AM control signal on connection 546 and the output of the adder 652 is provided via connection to 654 to the low pass filter 656. The low pass filter 656 may be a passive device or an active device having a frequency response and a gain value. The output of the low pass filter 656 on connection 658 is combined with the AM control signal on connection 546 in the adder 662. The output of the adder 662 is provided via connection 664 to the inner AM control loop 620.

The outer AM correction loop 610 operates at a wide bandwidth (in this example approximately 2 MHz) compared to the inner AM correction loop 620 and can correct offsets, and distortion that can exist in the forward path through the power amplifier 585. The outer AM correction loop 610 also linearizes the control loop and corrects any AM control nonlinearity present in the power amplifier 585.

The inner AM correction loop 620 includes the peak detector 628, baseband VGA 634, an adder 638, a low pass filter 644 and a VGA 648. While the baseband VGA 634 and the VGA 648 are shown as amplifiers, the baseband VGA 634 and the VGA 648 can be any variable gain elements. The output of the baseband VGA 634 on connection 636 is also provided to an adder 638. Another input to the adder 638 is the AM control signal on connection 546. The signal on connection 636 is subtracted from the signal on connection 546 and provided as an output of the adder 638 on connection 642. The signal on connection 642 is provided to the low pass filter 644, the output of which on connection 646 is used to control the gain of the VGA 648. The low pass filter 644 may be a passive device or an active device having a frequency response and a gain value. The input to the VGA 648 is taken from the output of the adder 662. This signal on connection 664 represents the AM signal on connection 546 as corrected by the outer AM correction loop 610. The output of the VGA 648 on connection 568 is the control signal that is applied to the control port of the power amplifier 585 and includes the AM portion of the transmit signal. In this manner, the AM control signal on connection 546 is used to control the output power of the power amplifier 585 and is also used to impress the AM portion of the transmit signal.

The inner AM correction loop 620 employs multiplicative corrective feedback to allow the VGA 648 to compensate for gain changes in the forward path. The gain changes in the forward path may occur due to, for example, changing voltage standing wave ratio (VSWR), etc. The outer AM correction loop 610 employs linear corrective feedback to correct offset and non-linearity in the forward path. The inner AM correction loop 620 maintains a constant bandwidth in the outer AM correction loop 610 by forcing the outer AM correction loop 610 to have a constant gain. Therefore, any impedance change at the output of the power amplifier 585, or any electrical change that affects the gain in the forward path, is canceled by the VGA 648. This forces the gain and bandwidth of the outer AM correction loop 610 to be constant. In this example, the bandwidth of the inner AM correction loop 620 is approximately 200 kHz. The VGA 648 maintains the bandwidth of the outer AM correction loop 510 at a constant value to maintain high bandwidth in AM correction loop 510 while maintaining loop stability.

Even if the control input to the power amplifier 585 were to remain constant, changes that affect the output load of the power amplifier 585 would change the gain of the RF signal through the power amplifier 585, and thus change the gain between the control signal 568 and the detected signal 636. The correction bandwidth of outer AM correction loop 610 can be proportional to the gain of the feedback loop, including the gain through the power amplifier 585 and the VGA 648. Additionally, the stability of the outer AM correction loop 610 can be compromised if the loop gain is too high. Thus, it is important to keep the loop gain sufficiently high so as to correct any AM distortion, while keeping the loop gain low enough so as to ensure stability. Therefore the VGA 648 is used to correct gain variations in the power amplifier 585, maintaining a constant overall loop gain for the outer AM correction loop 610. Thus, using the inner AM correction loop 620 as a corrective feedback path allows stable control without restricting overall system bandwidth.

Due to the placement of the low pass filters 656 and 644 in the feedback paths instead of in the forward path, the forward bandwidth from the AM input signal on connection 546 to the power amplifier output on connection 556 is nearly independent of the response of both the inner and outer AM correction loops and is dependent only on the bandwidth of the power amplifier. In this manner, the feedback is corrective and not integrated, so changes to the forward path are made with a very low delay. The high bandwidth and low signal delay provided by the inner and outer AM correction loops provide accurate control of the power output of the power amplifier 585 using the VGA 648 and provide a highly linear control through the wide bandwidth outer AM correction loop 610.

The phase correction loop 630 includes the variable attenuator 608, a limiter 614, a phase detector 618, a low pass filter 624 and a phase shifter 700. The output signal of the variable attenuator on connection 612 is provided to a limiter 614. The limiter 614 removes the AM portion of the signal from the output on connection 612 and provides an input to the phase detector 618. The other input to the phase detector 618 is the PM signal on connection 584. The phase detector 618 determines a difference between the phase of the signal on connection 616 and the phase of the signal on connection 584 and provides an error signal on connection 622 representing the difference. The error signal is provided to the low pass filter 624, which provides an output to the phase shifter 700 on connection 626. The signal on connection 626 determines the extent to which the phase shifter 700 will shift the phase of the input signal on connection 584 and provide an appropriate PM input signal to the power amplifier 585 via connection 604.

The phase shifter 700 provides a phase shift range that exceeds 90 degrees and allows accurate and substantially linear control of the phases' slope as a function of the error signal on connection 626.

The variable attenuator 608 provides coarse power control. By varying the attenuation of the feedback signal on connection 557, the variable attenuator 608 can control the output power of the power amplifier 585 through outer AM correction loop 610. The variable attenuator 608 also maximizes the range of the peak detector 628 range by keeping the operating point of the peak detector 628 relatively constant. The output power of the power amplifier 585 will settle to a level set by the outer AM correction loop 610. The baseband control signal on 532 determines the gain of the baseband VGA 634 and the closed loop control maintains the output of the baseband VGA 634 equal to the AM signal on connection 546. In an embodiment, the feedback signal to the AM correction loops and the phase correction loop is provided from separate variable attenuators.

The AM control signal provided to the power amplifier 585 via connection 568 may change the phase delay characteristics of the power amplifier 585 and induce a phase change. One mechanism which can cause this effect is that the change in output power induced by the change in the control signal 568 can cause the phase delay to change due to an AM/PM conversion mechanism in the power amplifier 585. The phase correction loop 630 provides a retarded or advanced phase of the signal on connection 584 to power amplifier 585 based on the error signal from the phase detector 618. The corrective characteristics of the phase detector 618 are encompassed by the bandwidth of the inner and outer AM correction loops. The phase correction loop 630 does not alter the phase of the signal on connection 584 if phase distortion is not present.

The power amplifier 585, phase correction loop 630, the outer AM correction loop 610 and the inner AM correction loop 620 can be fabricated on the same semiconductor die. In this manner, the response of the components will be closely matched with respect to temperature and process.

Figure 7:
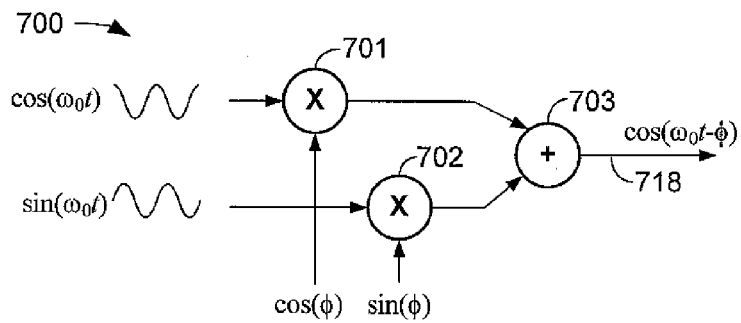
FIG. 7 is a schematic diagram illustrating a phase shifter in accordance with an embodiment of the invention.

FIG. 7 is a schematic diagram illustrating a phase shifter 700 in accordance with an embodiment of the invention. The phase shifter 700 comprises multipliers 701 and 702 and a signal combiner 703. The multipliers 701 and 702 may be implemented using variable gain amplifiers (VGAs), mixers, or other suitable circuits. The combining element 703 may be implemented using a summing amplifier, a Wilkinson combiner, or another suitable circuit or configuration. In an embodiment, the summing element 703 may be a node in the circuit in which currents are combined into a load.

The multiplier 701 is configured to receive an alternating current (ac) input signal having a first phase, such as 0 degrees (cosine) and a gain control signal having a signal value of approximately $\cos(\phi)$, where $\phi$ is the amount of desired phase shift. The multiplier 702 is configured to receive an ac input signal having a second phase, which should be approximately 90 degrees different than the first phase, such as 90 degrees (sine). The multiplier 702 is also configured to receive a gain control signal having a signal value of approximately $\sin(\phi)$. The outputs of the multipliers 701 and 702 are summed in the signal combiner 703 producing a phase shifted output on connection 718. The input signals may optionally have additional phase modulation, such as if the phase shifter 700 is implemented in the power amplifier control element 587, where it can receive phase modulated input signals 584.

The output on connection 718 can have a signal equal to $\cos(\omega_0 t)*\cos(\phi)+\sin(\omega_0 t)*\sin(\phi)$. Using basic trigonometric identities this is equivalent to $\cos(\omega_0 t-\phi)$. This is the response of the phase shifter 700 implementing a phase shift of $\phi$ with constant output amplitude. The accuracy of the output amplitude and phase can be primarily limited by the accuracy of the phase difference between the two ac input signals $\cos(\omega_0 t)$ and $\sin(\omega_0 t)$, as well as the accuracy of the gain of the multipliers 701 and 702 and the accuracy of the $\cos(\phi)$ and $\sin(\phi)$ gain control input signals.

Since the desired phase difference between the ac input signals is 90 degrees, any of the well known techniques for generating quadrature signals may be used, such as using a polyphase filter, a quadrature divider, a microwave hybrid, or another suitable circuit. Other circuits capable of producing phase shifts can be used, provided that sufficient accuracy of the phase shifted input signals can be obtained.

The gain control signals $\cos(\phi)$ and $\sin(\phi)$ can be implemented digitally, such as by using a lookup table, or by an analog circuit capable of producing a reasonable approximation of $\cos(\phi)$ and $\sin(\phi)$ over the desired phase shift range of $\phi$. For example, a linear circuit having discrete components or another suitable circuits, can be used to generate the gain control signals $\cos(\phi)$ and $\sin(\phi)$.

Figure 8:
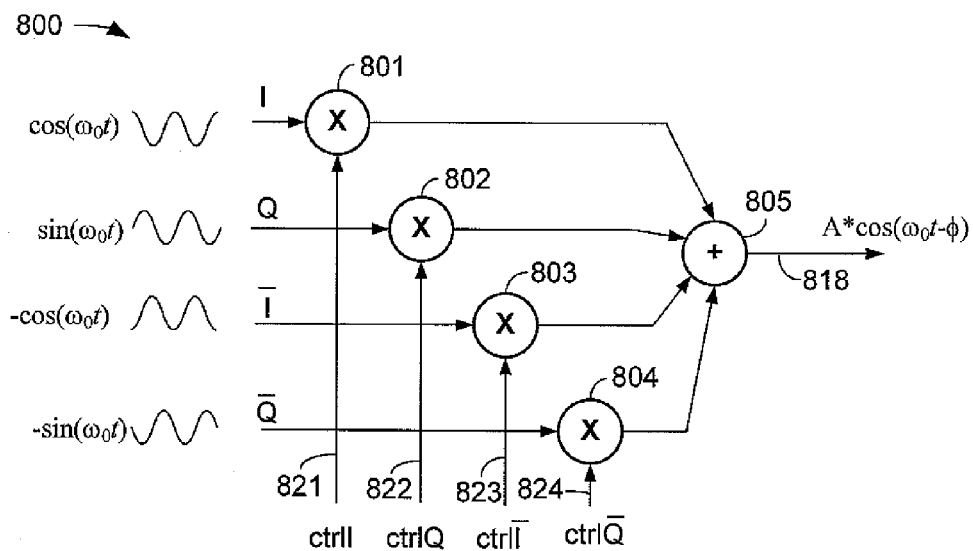
FIG. 8 is a schematic diagram illustrating a phase shifter 800 in accordance with an embodiment of the present invention.

FIG. 8 is a schematic diagram illustrating a phase shifter 800 in accordance with an embodiment of the present invention. The phase shifter 800 uses single polarity gain control signals on connections 821, 822, 823 and 824. The phase shifter 800 comprises multipliers 801, 802, 803 and 804 and a signal combiner 805. The multiplier 801 is configured to receive an ac input signal having a first phase, such as 0 degrees (cosine). The multiplier 802 is configured to receive an ac input signal having a second phase approximately 90 degrees different than the first phase, such as 90 degrees (sine). The multiplier 803 is configured to receive an ac input signal having a phase (−cosine) that is approximately 180 degrees different relative to the first phase, and the multiplier 804 is configured to receive an ac input signal having a phase (−sine) that is approximately 180 degrees different relative to the second phase. The signal combiner 805 is configured to sum the outputs of the multipliers 801, 802, 803 and 804 to produce a phase shifted output on connection 818. The multipliers 801, 802, 803 and 804 are farther configured to receive gain control signals ctrlI, ctrlQ, ctrl$\overline{I}$ and ctrl$\overline{Q}$ respectively, on connections 821, 822, 823 and 824, respectively. The multipliers 801, 802, 803 and 804 and the signal combiner 805 may be of any suitable type, such as are suitable for use in the phase shifter 700 of FIG. 5, or other suitable types. The amplitude of each quadrature component supplied to the multipliers 801, 802, 803 and 804 is altered based on the value of the respective gain control signals.

The output on connection 818 can have a signal equal to $\cos(\omega_0 t)*(\text{ctrlI}-\text{ctrl}\overline{I})+\sin(\omega_0 t)*(\text{ctrlQ}-\text{ctrl}\overline{Q})$. By selecting appropriate values for signals ctrlI and ctrl$\overline{I}$, each can take on values of a single polarity while their difference ctrlI−ctrl$\overline{I}$ can take on both positive and negative values to approximate $\cos(\phi)$ over the desired range of phase shift $\phi$. For example, ctrlI could be made to be max(0, $\cos(\phi)$)) while ctrl$\overline{I}$ was made to be max(0, $-\cos(\phi)$)) over the desired phase control range of $\phi$. Other selections may be made, such as to generate positive nonzero values for both signals ctrlI and ctrl$\overline{I}$ across the range or to cause at least one of the signals to be nonzero for each phase shift value in the range. In a similar manner, appropriate values for ctrlQ and ctrl$\overline{Q}$ can be selected so that each can take on values of only a single polarity while their difference crtlQ−ctrl$\overline{Q}$ can be approximately equal to $\sin(\phi)$. Using this technique, the $\cos(\phi)$ and $\sin(\phi)$ functions may be provided using only single-polarity signals, allowing the multipliers 801, 802, 803 and 804 to be implemented as variable gain elements, each providing a controllable single-polarity gain.

The $\cos(\omega t)$ and $\sin(\omega t)$ terms are notionally the same as the signals on connection 584 (FIG. 6). As will be described below, the $\cos(\omega t)$ and $\sin(\omega t)$ signals can be generated using a quadrature divider or an RC polyphase filter. In the system diagram of FIG. 6, the signal on connection 584 can be a pair of correlated quadrature signals $\sin(\omega t+\text{phase modulation})$ and $\cos(\omega t+\text{phase modulation})$. Alternately, the signal on connection 584 can be a single-ended or differential signal and a suitable polyphase filter or quadrature divider can be used to generate the quadrature signals locally to the phase shifter. When used in other applications or systems, suitable phase shifted signals can be either provided or generated locally.

Figure 16:
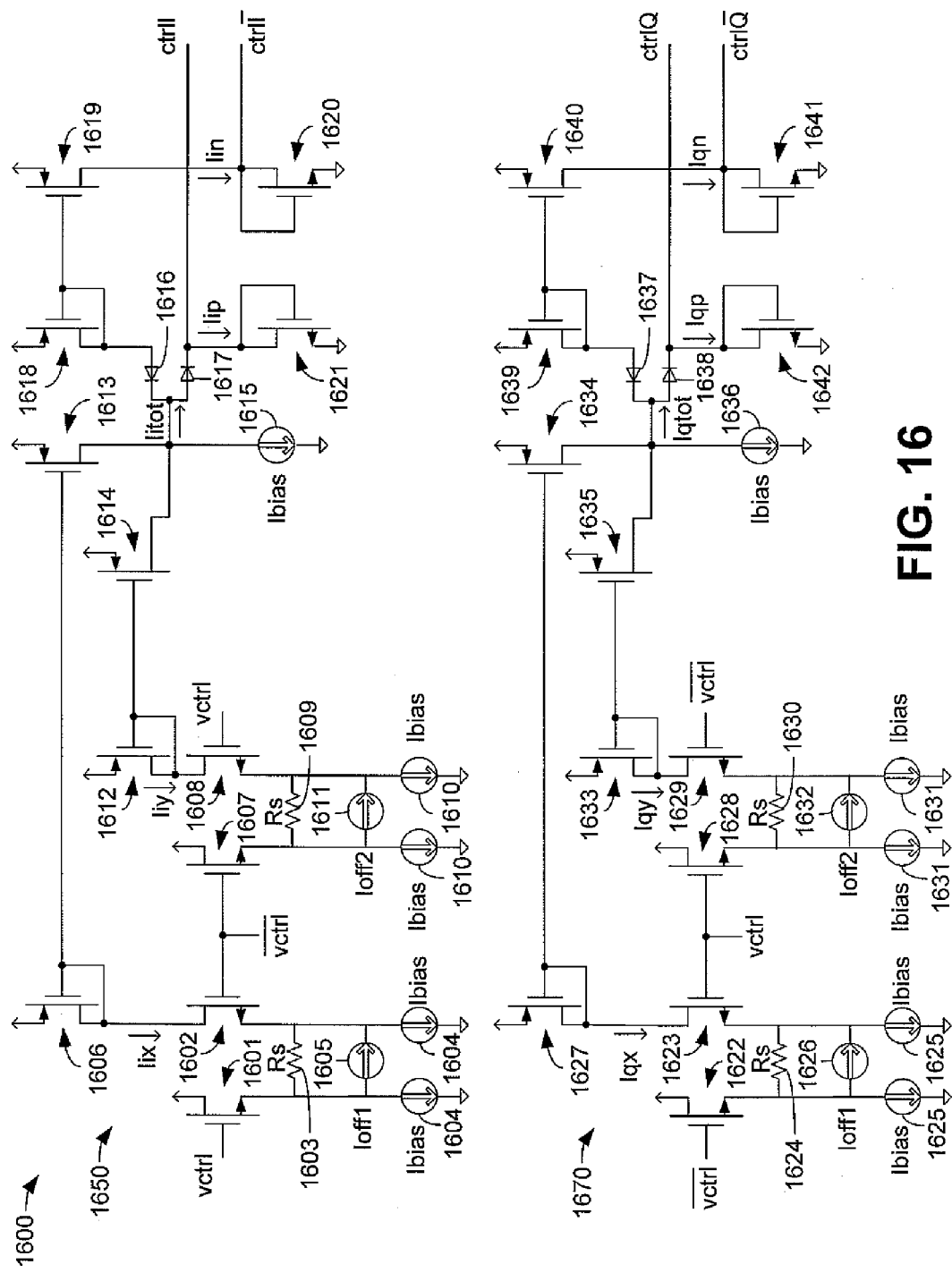
FIG. 16 is a schematic diagram of a control circuit suitable for generating the control signals of a phase shifter in accordance with an embodiment of the present invention.

As will be described below, the ctrlI, ctrlQ, ctrl$\overline{I}$ and ctrl$\overline{Q}$ signals are generated from the error signal on connection 626 (FIG. 6) using a suitable circuit, e.g. the circuit 1600 described below in FIG. 16. In FIG. 16, the differential signal vctrl−$\overline{\text{vctrl}}$ can be the error signal on connection 626. So the error signal on connection 626 represents the desired phase shift phi ($\phi$). The phase detector 618 (FIG. 6) is configured to have a fairly large gain, so that for even a small change in the relative phases of the RF input signals, the output voltage of the phase detector 618 will request a much greater change in the phase shift of the phase shifter 700. In an embodiment, the phase detector has a gain in the range of 20 dB, so that if there is a 1 degree change in the output phase versus the input phase, the phase detector 618 will request a 10 degree correction change in the phase shifter 700. This causes the loop to very quickly and accurately get to a phase error of nearly zero.

Figure 9:
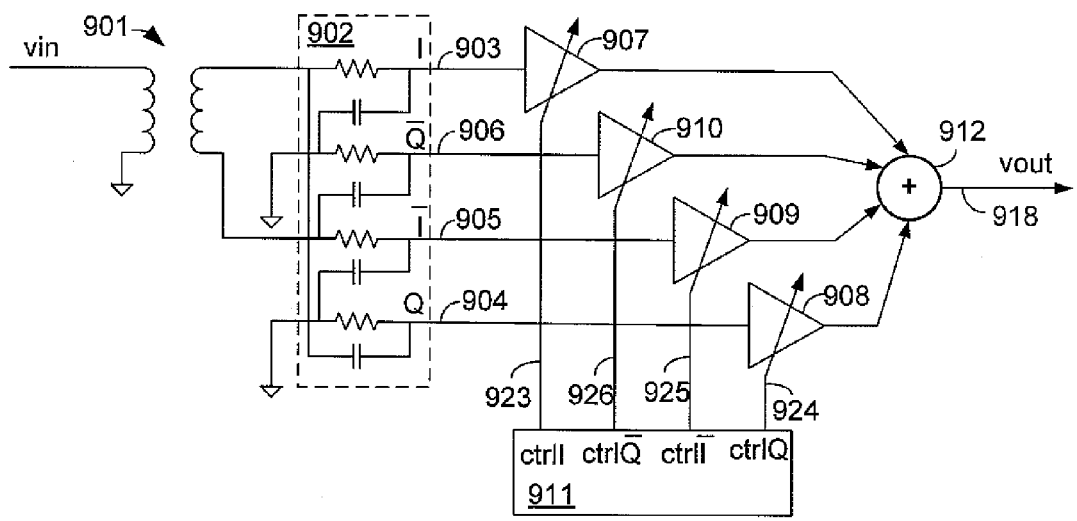
FIG. 9 is a schematic diagram of a phase shifter 900 in accordance with an embodiment of the invention.

FIG. 9 is a schematic diagram of a phase shifter 900 in accordance with an embodiment of the invention. The phase shifter 900 includes a polyphase filter 902, which generates the ac input phase shift signals on connections 903, 904, 905 and 906. The phase shifter 900 comprises a balun 901, a polyphase filter 902, multipliers 907, 908, 909 and 910, and a signal combiner 912. The balun 901, which may be a transformer or other suitable balun, can be used to convert a single-ended (non-differential) ac input signal into differential signals to provide a differential input to the polyphase filter 902. If differential signals are available, the differential signal can be connected directly to the polyphase filter 902 without the need for the balun 901. The polyphase filter 902 generates substantially quadrature ac input signals on connections 903, 904, 905 and 906 from the differential signals provided by the balun 901. The polyphase filter 902 may be a single- or multi-stage resistive-capacitive (RC) polyphase filter, or another suitable polyphase capable of producing output signals with substantially quadrature phase relationship.

The polyphase filter 902 is implemented so that the quadrature signals on connections 903 and 904 have a phase difference of approximately 90 degrees. The polyphase filter 902 is similarly implemented so that the signals on connections 903 and 905 have approximately 180 degrees of phase difference, and so that the signals on connections 904 and 906 have approximately 180 degrees of phase difference.

In this example, the multipliers 907, 908, 909 and 910 are configured as variable gain amplifiers. However, the multipliers may be other suitable multipliers. The multipliers are configured to receive quadrature ac input signals on connections 903, 904, 905 and 906 respectively. The multipliers 907, 908, 909 and 910 are also configured to receive gain control signals ctrlI, ctrlQ, ctrl$\bar{I}$ and ctrl$\bar{Q}$ on connections 923, 924, 925 and 926, respectively. The outputs of multipliers 907, 908, 909 and 910 can be summed using signal combiner 912 to generate a phase shifted output on connection 918.

The gain control signals ctrlI, ctrlQ, ctrl$\bar{I}$ and ctrl$\bar{Q}$ are generated by a control circuit 911 using a control input signal vctrl. The signals ctrlI and ctrl$\bar{I}$ can be generated so that ctrlI–ctrl$\bar{I}$ is approximately equal to cos(k*(vctrl–$v_0$)) where k is the control gain and $v_0$ is an optional input offset. Similarly, signals ctrlQ and ctrl$\bar{Q}$ can be generated so that ctrlQ–ctrl$\bar{Q}$ is approximately equal to sin(k*(vctrl–$v_0$)). Prudent selection of the signals ctrlI, ctrlQ, ctrl$\bar{I}$ and ctrl$\bar{Q}$ can result in having signals of only a single polarity, such as positive or negative, positive non-zero signals, or signals with other desirable properties. This applies to the alternative embodiments of the phase shifter described herein using the signals ctrlI, ctrlQ, ctrl$\bar{I}$ and ctrl$\bar{Q}$.

Figure 10A:
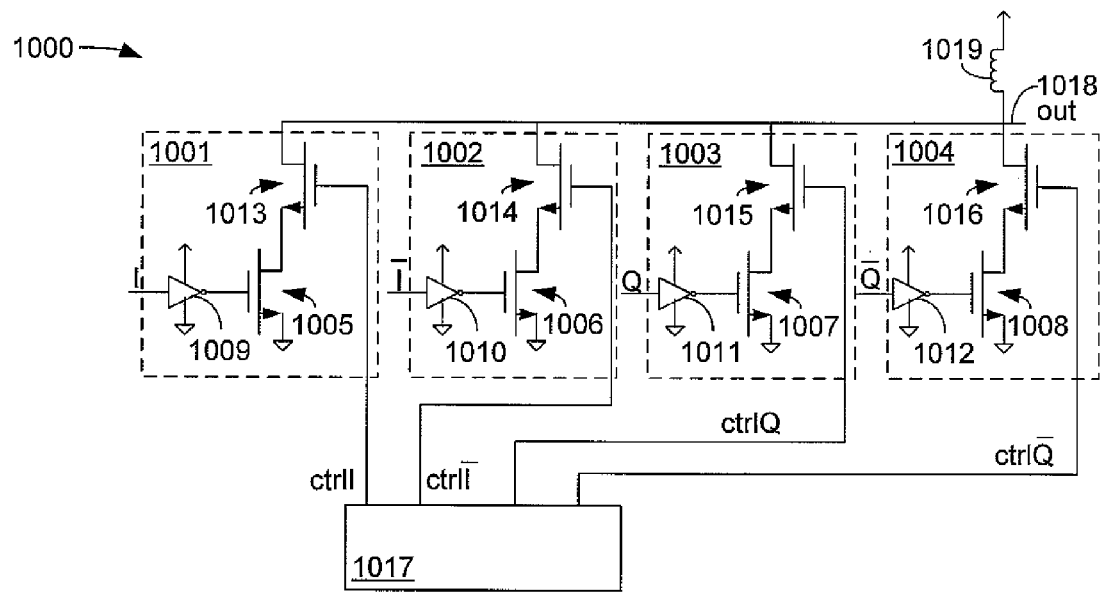
FIG. 10A is a schematic diagram of a phase shifter in accordance with an embodiment of the present invention.

FIG. 10A is a schematic diagram of a phase shifter 1000 in accordance with an embodiment of the present invention. This phase shifter 1000 comprises variable gain amplifiers 1001, 1002, 1003 and 1004, control circuit 1017, and an optional load inductor 1019.

The variable gain amplifiers 1001, 1002, 1003 and 1004 are configured to receive quadrature ac input signals I, $\bar{I}$, Q and $\bar{Q}$ respectively. Signals I and Q can have 90 degrees of phase difference, I and $\bar{I}$ can have 180 degrees of phase difference, and Q and $\bar{Q}$ can have 180 degrees of phase difference. These quadrature input signals may be generated by a polyphase filter, quadrature divider, or other suitable circuit. The signals referred to as I, Q, $\bar{I}$ and $\bar{Q}$ correspond to the signals cos(ωt), sin(ωt), –cos t(ωt), and –sin(ωt), respectively, and can be used interchangeably.

In an embodiment, the variable gain amplifier 1001 comprises a switching transistor 1005 and a gain control transistor 1013. An optional amplifier, implemented in this example as an inverter 1009, may be used to increase the level of the ac input signal so that the switching transistor 1005 receives a sufficiently large input signal so that it effectively operates as a switch. The switching transistor 1005 can operate as a switch to alternately open and close a path through gain control transistor 1013 between an output node 1018 and a common node such as ground. The gain control transistor 1013 can be used to adjust the current that occurs during those times when the switching transistor 1005 is closed, such as by adjusting the gate voltage of the transistor 1013 using a signal provided by the control circuit 1017. The current that flows through the gain control transistor 1013 is related only to the gate-source voltage Vgs of the gain control transistor 1013, thus enabling precise control of the gain of the variable gain amplifier 1001. In this way, the variable gain amplifier 1001 causes an ac current to flow into the output node 1018 with the phase of the output signal determined by the phase of the ac input signal, I, provided to the switching transistor 1005 and having an amplitude adjustable through the gain control transistor 1013. The variable gain amplifiers 1002, 1003 and 1004 can be implemented in a similar fashion to amplify the other ac signal phases, $\bar{I}$, Q and $\bar{Q}$, using switching transistors 1006, 1007 and 1008 respectively, gain control transistors 1014, 1015 and 1016 respectively, and optional amplifiers 1010, 1011 and 1012 respectively.

If each of the variable gain amplifiers 1001, 1002, 1003 and 1004 are connected to the same output node 1018, the currents from these amplifiers can be summed. Control circuit 1017 can be used to provide gain control signals ctrlI, ctrl$\bar{I}$, ctrlQ and ctrl$\bar{Q}$ to variable gain amplifiers 1001, 1002, 1003 and 1004 to adjust the gains of each phase to form a phase shifted output. A load component, such as optional inductor 1019 may be used to convert the summed current into a voltage if desired. Alternately, other components, such as resistors or other suitable circuits may be used.

Figure 10B:
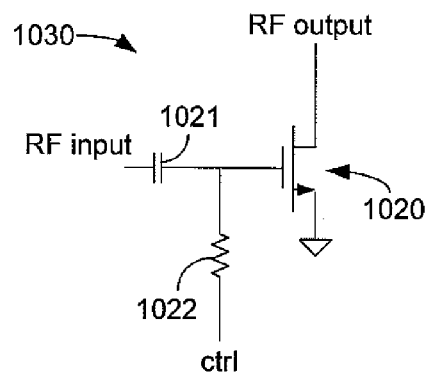
FIG. 10B is a schematic diagram of an alternative variable gain amplifier in accordance with an embodiment of the present invention.

FIG. 10B is a schematic diagram of an alternative variable gain amplifier 1030 in accordance with an embodiment of the present invention. The variable gain amplifier 1030 comprises an amplifying transistor 1020, a capacitor 1021, and a resistor 1022. An rf input signal is coupled to the transistor 1020 through the capacitor 1021, and a gain control signal, which can be supplied as a voltage, is coupled to the transistor 1020 through the resistor 1022. The gain of the rf input signal through the amplifying transistor 1020 can be adjusted using the gain control signal supplied to the resistor 1022. An instance of the variable gain amplifier 1030 can be used as a variable gain element in the phase shifter 1000 of FIG. 10A, in place of the variable gain amplifiers 1001, 1002, 1003 and 1004 if it is desired to allow the passage of an amplitude modulated ac input signal through the variable gain amplifiers so as to retain the amplitude modulation at the phase shifted output.

Figure 11:
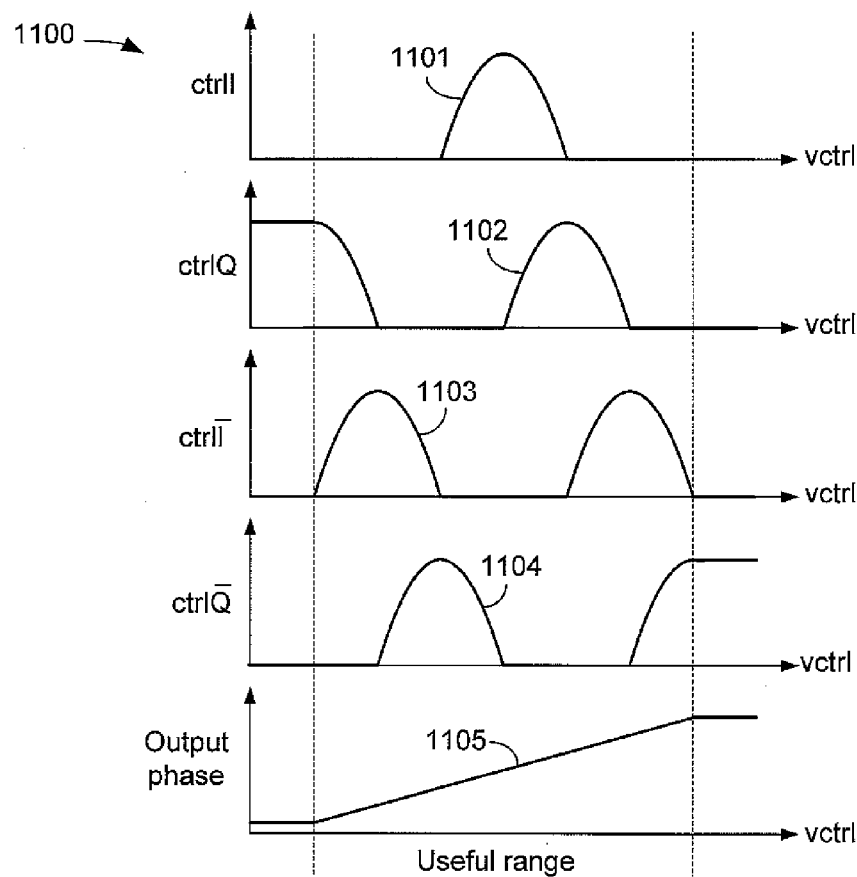
FIG. 11 is a graphical diagram showing the gain control signals used in accordance with an embodiment of the present invention, such as may be provided to the various variable gain amplifiers in the phase shifters of FIG. 8, FIG. 9, FIG. 10A, and other suitable phase shifters.

FIG. 11 is a graphical diagram showing the gain control signals used in accordance with an embodiment of the present invention, such as may be provided to the various variable gain amplifiers in the phase shifters of FIG. 8, FIG. 9, FIG. 10A, and other suitable phase shifters. The gain control signals ctrlI, ctrl$\bar{I}$, ctrlQ and ctrl$\bar{Q}$ are plotted versus an input control signal, vctrl, such as may be provided to the control circuits 911 and 1017. The control signal ctrlI, represented by waveform 1101 can be made to have value of $A_0$*max(0,cos(k*(vctrl–$v_0$))) over the useful range of the phase shifter, where $A_0$ is an arbitrary amplitude, $v_0$ is an input offset, and k is a phase control slope. Similarly, the control signal ctrl$\bar{I}$, represented by waveform 1103, can be made to have value of $A_0$*max(0,–cos(k*(vctrl–$v_0$))) over the useful range. The control signal ctrlQ, represented by waveform 1102, can be made to have value of $A_0$*max(0,sin(k*(vctrl–$v_0$))) over the useful range. The control signal ctrl$\bar{Q}$, represented by waveform 1104, can be made to have value of $A_0$*max(0,–sin(k*(vctrl–$v_0$))) over the useful range. In this way, (ctrlI–ctrl$\bar{I}$) and (ctrlQ–ctrl$\bar{Q}$) can be made to have value of $A_0$*cos(k*(vctrl–$v_0$)) and $A_0$*sin(k(vctrl–$v_0$)) respectively over the useful range. As can be seen in the waveforms 1101, 1102, 1103 and 1104, this can be achieved while all of the control signals individually can have non-negative values.

By applying the control signals ctrlI, ctrlĪ, ctrlQ and ctrlQ̄ to adjust the gain of the multipliers 801, 802, 803 and 804, where each of the multipliers receives an input ac signal such that the several ac input signals have quadrature phase, the summed output of the multipliers can have a phase shift that changes linearly over the useful range. The multipliers 801, 802, 803 and 804 are used for example purposes only. The signals ctrlI, ctrlĪ, ctrlQ and ctrlQ̄ can be used to adjust the gain of any of the variable gain elements described herein. This phase shift is represented by the waveform 1105.

Outside of the useful range, the control signals ctrlI, ctrlĪ, ctrlQ and ctrlQ̄ can take on other values. In an embodiment, the control signals ctrlI, ctrlĪ, ctrlQ and ctrlQ̄ can each be substantially the same as their respective values at the lower limit of their control range for control signals below the lower limit of the control range and can be substantially the same as their respective values at the upper limit of the control range for control signals above the control range. This selection of control values for signals outside of the control range can have benefit by making the phase response continuous over the control voltage while also making the phase gain outside the control range equal to zero. While the control range depicted in FIG. 11 is approximately 540 degrees, other control ranges can be used.

Figure 12:
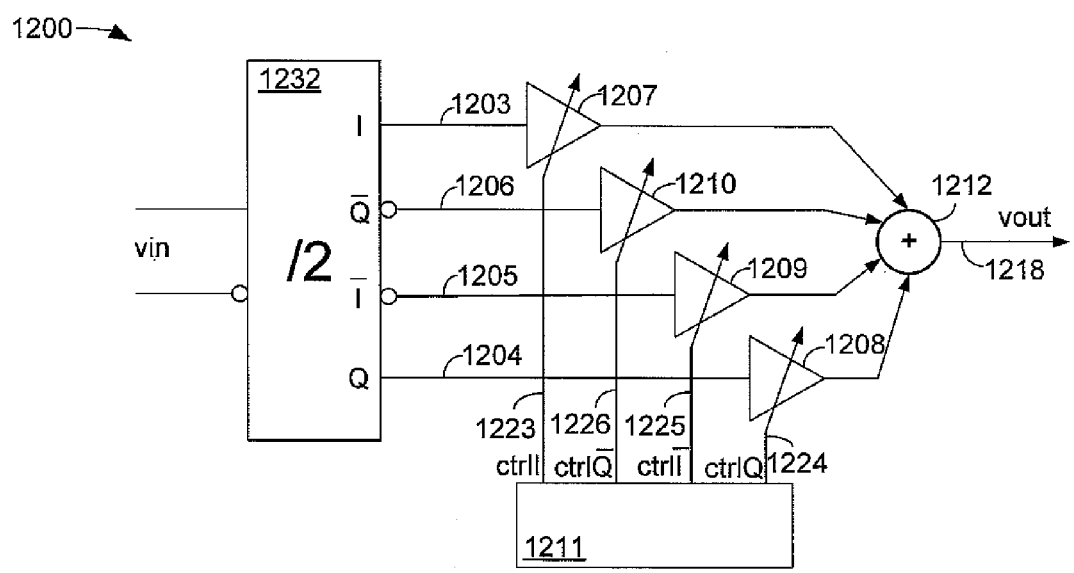
FIG. 12 is a schematic diagram of a phase shifter in accordance with an alternative embodiment of the present invention.

FIG. 12 is a schematic diagram of a phase shifter 1200 in accordance with an alternative embodiment of the present invention. The phase shifter 1200 is similar to the phase shifter 900 of FIG. 9. Accordingly, the elements of FIG. 12 that are similar to the elements of FIG. 9 will be described using the nomenclature 12XX, where 12XX is refers to the element 9XX in FIG. 9. The phase shifter 1200 uses a quadrature frequency divider 1232 to generate ac input signals I, Ī, Q and Q̄. The quadrature frequency divider 1232 is configured to receive an ac input signal at a first frequency, which can be, for example, twice the desired output frequency. Other input frequencies are possible, such as four times the output frequency or other suitable frequencies. The quadrature divider 1232 generates quadrature ac signals 1203, 1204, 1205 and 1206.

Figure 13:
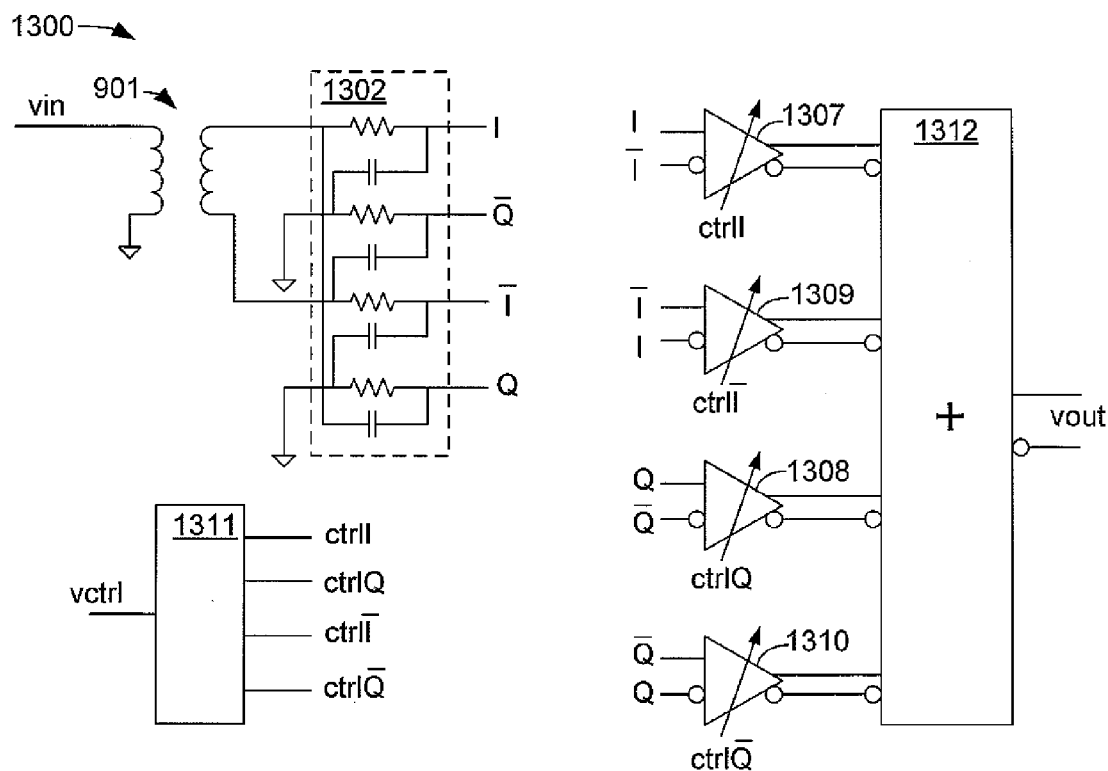
FIG. 13 is a schematic diagram of a differential phase shifter in accordance with another alternative embodiment of the present invention.

FIG. 13 is a schematic diagram of a differential phase shifter in accordance with another alternative embodiment of the present invention. The phase shifter 1300 is similar to the phase shifter 900 of FIG. 9. Accordingly, the elements of FIG. 13 that are similar to the elements of FIG. 9 will be described using the nomenclature 13XX, where 13XX refers to the element 9XX in FIG. 9. The phase shifter 1300 uses a polyphase filter 1302 to generate phase shifted ac input signals and differential variable gain amplifiers 1307, 1308, 1309 and 1310.

The variable gain amplifier 1307 is configured to receive ac input signal I at its non-inverted input port and receive ac input signal Ī at its inverted input port, and receive gain control signal ctrlI. The variable gain amplifier 1308 is configured to receive input ac signal Q and Q̄ at its non-inverted and inverted input ports, respectively, and to receive gain control signal ctrlQ. The variable gain amplifier 1309 is configured to receive ac input signal Ī and I at its non-inverted and inverted input ports, respectively, and to receive gain control signal ctrlĪ. The variable gain amplifier 1310 is configured to receive ac input signal Q̄ and Q at its non-inverted and inverted input ports, respectively, and to receive gain control signal ctrlQ̄. The outputs of the differential variable gain amplifiers 1307, 1308, 1309 and 1310 are coupled to differential signal combiner 1312, which sums their differential signals to generate an output phase shifted ac signal. The output phase shifted ac signal may be differential or single-ended depending on the type of signal combiner used.

Figure 14B:
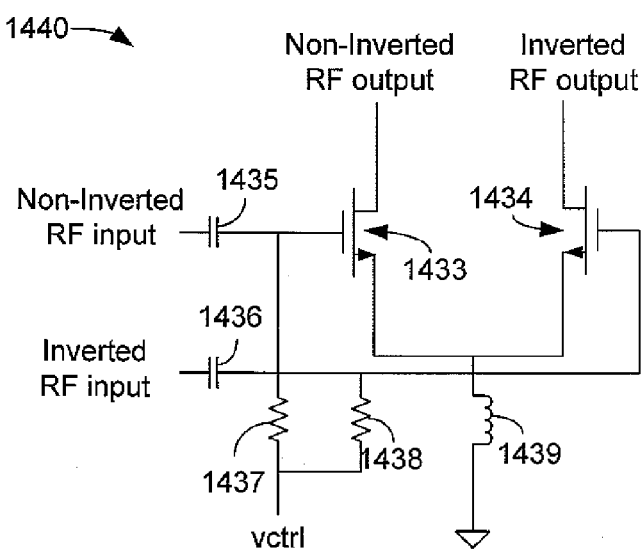
FIG. 14B is a schematic diagram of a differential variable gain amplifier in accordance with an embodiment of the present invention.
Figure 14A:
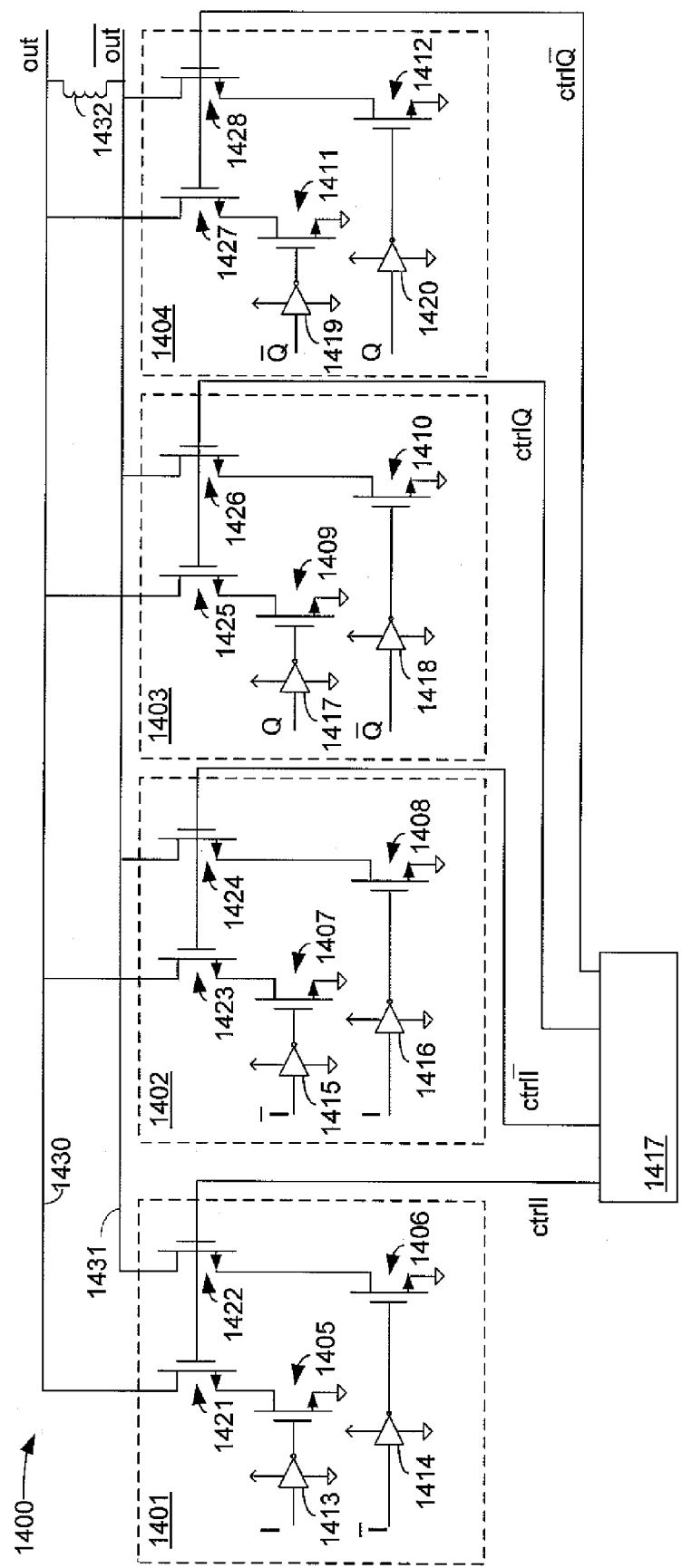
FIG. 14A is a schematic diagram of a differential phase shifter in accordance with another embodiment of the present invention.

FIG. 14A is a schematic diagram of a differential phase shifter 1400 in accordance with an embodiment of the present invention. This phase shifter 1400 comprises variable gain amplifiers 1401, 1402, 1403 and 1404, a control circuit 1417, and optional center-tapped load inductor 1432.

The variable gain amplifier 1401 comprises switching transistors 1405 and 1406, gain control transistors 1421 and 1422, and optional amplifiers 1413 and 1414. The switching transistors 1405 and 1406 are configured to receive ac input signals I and Ī. The switching transistor 1405 can operate as a switch, alternately opening and closing a path through the gain control transistor 1421 between a non-inverted output node 1430 and a common node such as ground. The switching transistor 1406 can operate as a switch, alternately opening and closing a path through the gain control transistor 1422 between an inverted output node 1431 and the common node.

The gain control transistor 1421 can be used to adjust the current that occurs during the times when the switching transistor 1405 is closed, by adjusting the gate voltage of the transistor 1421 using a signal provided by the control circuit 1417. The gain control transistor 1422 can be used to adjust the current that occurs during the times when switching transistor 1406 is closed, by adjusting the gate voltage of transistor 1422 using a signal provided by the control circuit 1417. In this way, the variable gain amplifier 1401 can cause a differential ac current between output nodes 1430 and 1431 with the phase determined by the differential ac input I–Ī provided to the switching transistors 1405 and 1406 and having an amplitude adjustable by the gain control transistors 1421 and 1422. The variable gain amplifiers 1402, 1403 and 1404 can be constructed to amplify their respective differential input signals in a similar manner.

The differential output currents of the differential variable gain amplifiers 1401, 1402, 1403 and 1404 can be summed, such as by connecting the differential outputs to common differential output nodes 1430 and 1431. An optional load component, such as center-tapped inductor 1432 may be used to transform this summed current into an output differential voltage if desired. Other components, such as resistors can also be used.

FIG. 14B is a schematic diagram of a differential variable gain amplifier in accordance with an embodiment of the present invention. The variable gain amplifier 1440 comprises amplifying transistors 1433 and 1434, capacitors 1435 and 1436, resistors 1437 and 1438, and optional common mode inductor 1439. Differential if input signals are coupled to the transistors 1433 and 1434 through capacitors 1435 and 1436, respectively, and a gain control signal, applied as a voltage, is coupled to the transistors 1433 and 1434 through the resistors 1437 and 1438, respectively. The gain of the differential RF input signal through the amplifying transistors 1433 and 1434 can be adjusted using the control voltage vctrl. An instance of the variable gain amplifier 1440 can be used as a variable gain element in the phase shifter 1400 of FIG. 14A, in place of the variable gain amplifiers 1401, 1402, 1403 and 1404, if it is desired that the phase shifter 1400 allow the passage of amplitude modulated ac input signals to retain the amplitude modulation at the phase shifted output.

Figure 15:
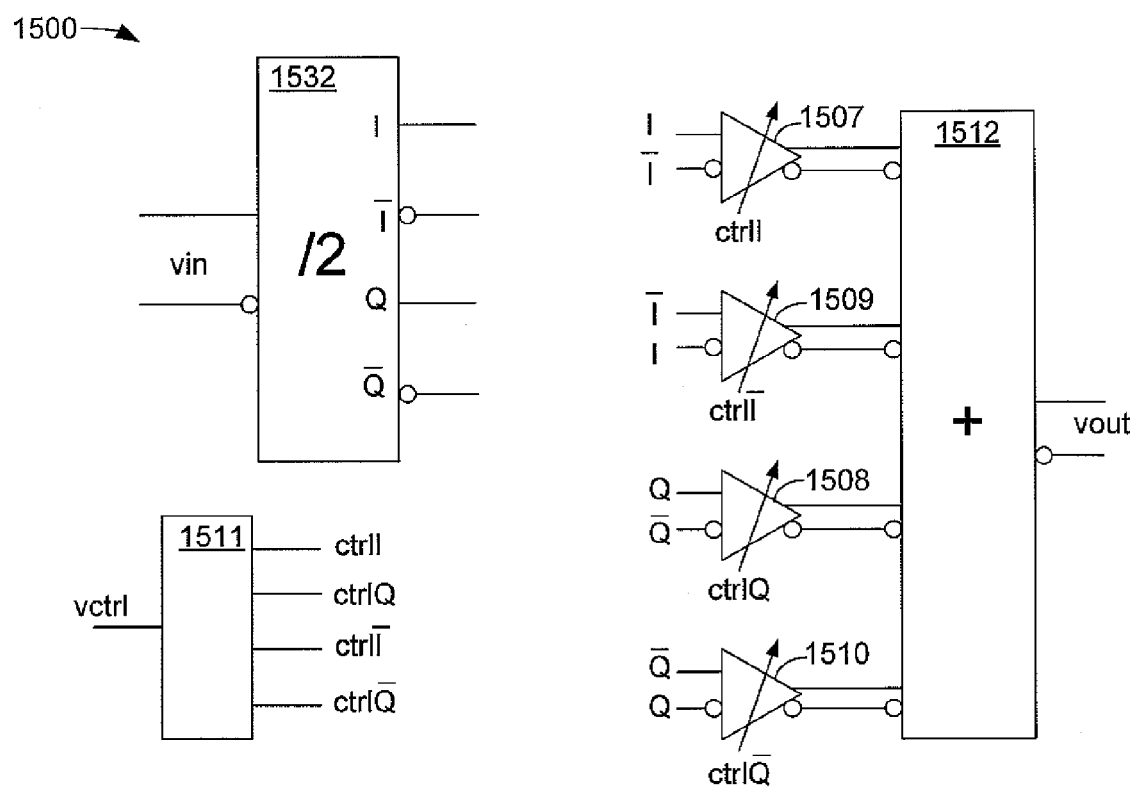
FIG. 15 is a schematic diagram of a phase shifter in accordance with an embodiment of the present invention.

FIG. 15 is a schematic diagram of a phase shifter 1500 in accordance with an embodiment of the present invention. The phase shifter 1500 is similar to the phase shifter 1300 of FIG. 13. Accordingly, the elements of FIG. 15 that are similar to the elements of FIG. 13 will be described using the nomenclature 15XX, where 15XX refers to the element 13XX in FIG. 13. The phase shifter 1500 uses a quadrature divider 1532 to generate phase shifted ac input signals and uses differential variable gain amplifiers 1507, 1508, 1509, 1510, which are similar to the variable gain amplifiers 1307, 1308, 1309 and 1310, respectively.

The variable gain amplifier 1507 is configured to receive ac input signal I at its non-inverted input port and receive ac input signal $\overline{I}$ at its inverted input port, and receive gain control signal ctrlI. The variable gain amplifier 1508 is configured to receive input ac signal Q and $\overline{Q}$ at its non-inverted and inverted input ports, respectively, and to receive gain control signal ctrlQ. The variable gain amplifier 1509 is configured to receive ac input signal $\overline{I}$ and I at its non-inverted and inverted input ports, respectively, and to receive gain control signal ctrl$\overline{I}$. The variable gain amplifier 1510 is configured to receive ac input signal $\overline{Q}$ and Q at its non-inverted and inverted input ports, respectively, and to receive gain control signal ctrl$\overline{Q}$. The outputs of the differential variable gain amplifiers 1507, 1508, 1509 and 1510 are coupled to differential signal combiner 1512, which sums their differential signals to generate an output phase shifted ac signal. The output phase shifted ac signal may be differential or single-ended depending on the type of signal combiner used.

FIG. 16 is a schematic diagram of a control circuit suitable for generating the control signals of a phase shifter in accordance with an embodiment of the present invention. The control circuit 1600 can be used as any of the control circuits 911, 1017, 1211, 1311, 1417 and 1511 to generate the control signals ctrlI, ctrl$\overline{I}$, ctrlQ and ctrl$\overline{Q}$ from differential input phase control signals vctrl and $\overline{vctrl}$.

The control circuit 1600 is differential and includes a circuit 1650 configured to generate the control signals ctrlI, ctrl$\overline{I}$ and a circuit 1670 configured to generate the control signals ctrlQ and ctrl$\overline{Q}$.

The circuit 1650 includes a first differential pair comprising transistors 1601 and 1602 along with gain degeneration resistor 1603 are provided bias currents Ibias 1604 and an offset current Ioff1 1605. Alternatively, the offset current function provided by 1605 can instead be provided by the devices 1604 that provide the bias current, such as by making one of the bias currents 1604 produce a current Ibias+Ioff1 and making the other of the bias currents 1604 produce a current Ibias−Ioff1. The offset current 1605 can be used to generate an input referred offset to the differential pair 1601 and 1602 of Ioff1*$R_S$, where $R_S$ is the resistance of the gain degeneration resistor 1603. This current can be used to shift the input differential voltage where the total bias current 2*Ibias is split equally between transistors 1601 and 1602 from nearly zero to a first input offset voltage. The differential pair 1601 and 1602 produces a current Iix from the drain of the transistor 1602. The current Iix can be approximately equal to the current Ibias at this first input offset. The current Iix increases as the differential input voltage is decreased (moved in a negative direction) until it saturates the transistor 1602 at approximately 2*Ibias. The current Iix decreases as the differential voltage is increased (moved in a positive direction) until the transistor 1602 saturates at a value of nearly zero.

A second differential pair comprising transistors 1607 and 1608 along with gain degeneration resistor 1609 are provided bias currents Ibias 1610 and an offset current Ioff2 1611. The offset current 1611, having current of Ioff2, can be used to generate an input referred offset to the differential pair 1607 and 1608 of Ioff2*$R_S$, where $R_S$ is the resistance of the gain degeneration resistor 1611. This current can be used to shift the input differential voltage where the total bias current 2*Ibias is split equally between transistors 1607 and 1608 from nearly zero to a second input offset voltage. Alternatively, the offset current function provided by 1611 can instead be provided by the devices 1610 that provide the bias current such as by making one of the bias currents 1610 produce a current Ibias+Ioff2 and making the other of the bias currents 1610 produce a current Ibias−Ioff2. The differential pair 1607 and 1608 produces a current Iiy from the drain of transistor 1608. The current Iiy can be approximately equal to Ibias at this second input offset. The current Iiy increases as the differential input voltage is increased (moved in a positive direction) until the transistor 1608 saturates at approximately 2*Ibias. The current Iiy decreases as the differential voltage is decreased (moves in a negative direction) until the transistor 1608 saturates at a value of nearly zero.

The currents Iix and Iiy are summed together and a constant current 1615 of value Ibias is subtracted from this sum to produce current Iitot. At input differential voltages above the first offset but below the second offset, Iitot can be negative, whereas outside of this range, the current Iitot can be positive.

For input voltages that result in negative current Iitot, a rectifying device 1616 can direct the current Iitot into a current mirror comprising transistors 1618 and 1619, which can provide a copy of the current Iitot to an optional gain shaping transistor 1620 to generate the gain control output voltage ctrl $\overline{I}$. The rectifying device 1617 can be reverse biased in this case, causing no current to flow through the optional gain shaping device 1621, causing the gain control output ctrlI to be nearly zero.

For input voltages which result in a positive current Iitot, the rectifying device 1617 can direct the current Iitot into the optional gain shaping transistor 1621 to generate gain control output ctrlI. In this instance, the rectifying device 1616 can be reverse-biased, causing no current to flow through the optional gain shaping device 1620, causing the gain control output ctrl$\overline{I}$ to be nearly zero.

The optional diode-connected transistor gain shaping devices 1620 and 1621 can be used to compensate for non-linear control characteristics of many variable gain amplifiers, such as the amplifier 1001, 1002, 1003, 1004 in FIG. 10A and the amplifiers 1401, 1402, 1403 and 1404 in FIG. 14A. The amplifiers can have a gain control profile approximately equal to the relationship between the gate voltage and drain current of a transistor. Other loads capable of converting voltages to currents can be used, such as resistors. This can be advantageous if the variable gain amplifiers controlled by the gain control voltages ctrl and ctrl$\overline{I}$ have different gain control nonlinearity type or if they have linear gain control. Alternately, if the amplifiers can accept a gain control signal as a current, the loads can be omitted and the current Iitot can be directed into the gain control ports of the variable gain amplifiers.

The gain control signals ctrlQ and ctrl$\overline{Q}$ can be generated by the circuit 1670 in a similar manner, except that a first differential pair 1622 and 1623 and a second differential pair 1628 and 1629 receive inverted inputs relative to the circuit 1650 generating the ctrlI and ctrl$\overline{I}$ signals.

Figure 17:
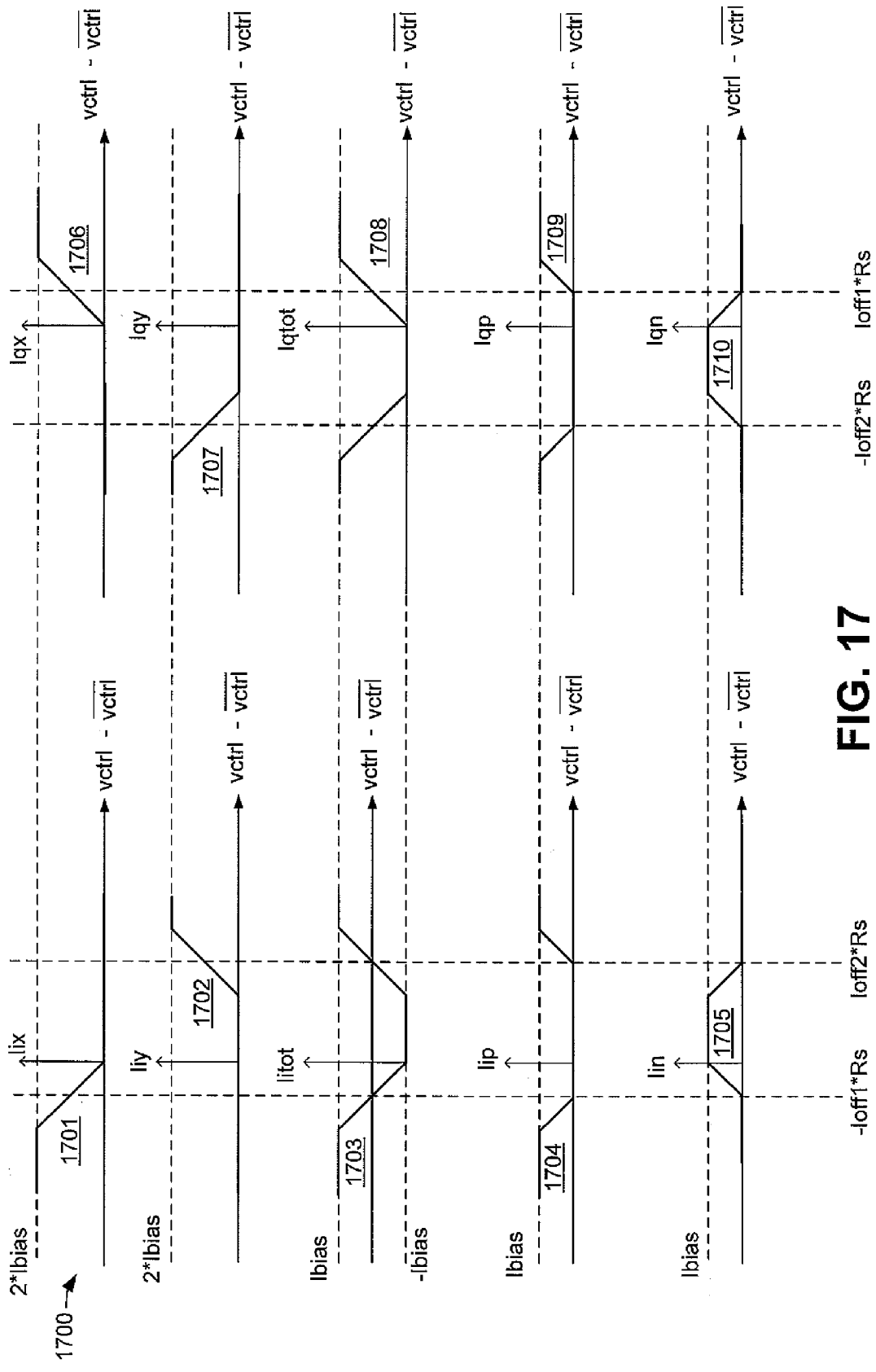
FIG. 17 is a graphical diagram of waveforms for various currents in the control circuit of FIG. 16.

FIG. 17 is a graphical diagram 1700 of waveforms for various currents in the control circuit depicted in FIG. 16. The diagram 1700 shows waveforms across different differential input voltages vctrl−$\overline{vctrl}$. The current Iix, represented by waveform 1701, which can have a value of 2*Ibias for very negative input voltage, begins to reduce until it is approximately Ibias when the input voltage is equal to the negative of the first offset voltage, and continues to reduce until it becomes zero for increasingly higher input voltage. The current Iiy, represented by waveform 1702, begins at approximately zero for very negative input voltage, begins to increase at a higher voltage until it reaches a value of approximately Ibias at the second offset voltage, and continues increasing until it reaches approximately 2*Ibias for increasingly higher input voltage. The slope of the change in current as a function of input voltage in those regions where the current is not saturated can be adjusted through selection of the appropriate resistor value $R_S$.

The current Iitot, being equal to Iix+Iiy−Ibias, can begin at value of Ibias for very negative input voltage, begins to reduce as current Iix reduces, becomes negative when Ibias becomes larger than Iix+Iiy, and then begins to increase again as Iiy begins to increase until again reaching a value of Ibias. This is represented in waveform 1703.

The current Iip, represented by waveform 1704 in the output path generating the ctrlI signal is equal to Iitot when Iitot is greater than zero, but is otherwise equal to zero. As a result, the current Iip begins at a value of approximately Ibias for very negative input voltages, decreases to approximately zero when the input is equal to the negative of the first offset voltage, remains zero until the input is approximately equal to the second offset voltage, and then increases until it reaches a value of approximately Ibias for increasing input voltage.

The current Iin, represented by waveform 1705, in the output path generating the ctrlI signal, is equal to −Itot when Itot is less than zero, but is otherwise equal to zero. As a result, the current Iin begins at a value of approximately zero, begins to increase when the input voltage is equal to the negative of the first offset until it reaches a value of approximately bias, and then begins to decrease until it reaches a value of approximately zero for input voltage equal to the second offset voltage, at which point it remains equal to zero for increasing input voltage.

The currents Iqx, Iqy, Iqtot, Iqp, and Iqn are depicted in waveforms 1706, 1707, 1708, 1709 and 1710, respectively. These waveforms can have the same behavior as their counterparts Iix, Iiy, Iitot, Iip and Iin respectively, except that they are mirrored about the y-axis due to the inputs to the differential pairs being inverted in the circuit generating them.

As shown by the waveforms 1703 and 1708, the currents Iitot and Iqtot can be reasonable approximations of two sinusoids over a single period, each shifted away from the y axis in opposite directions by about the same amount. By carefully selecting the offset current Ioff1 to be approximately ⅓ the offset current Ioff2, the amount of phase shift between the two sinusoids can be nearly 90 degrees. Careful selection of the resistor value $R_S$ can then be used to optimize the shapes of the waveforms. It can be seen that the range of this circuit is approximately 360 degrees, as each waveform begins and ends with the same value and goes through only a single period.

The waveforms 1704, 1705, 1709 and 1710 show how the formation of non-negative valued currents Iip, Iin, Iqp and Iqn, respectively, can be generated such that Iip−Iin is equal to Iitot and Iqp−Iqn is equal to Iqtot. Therefore four non-negative signals can be generated, which generate non-negative gain control voltages suitable for controlling the variable gain amplifiers described above to provide a phase shift range of 360 degrees. Similar circuits may be used to generate phase shifters with other ranges by combining the appropriate number of differential pairs with appropriate offset voltages.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A phase shifter, comprising:
   a plurality of variable gain elements, each variable gain element configured to receive one of a plurality of quadrature input signals, each quadrature input signal having a phase that is shifted with respect to each other input signal, wherein each variable gain element comprises a switching transistor and a gain control transistor coupled to the switching transistor, the gain control transistor configured to receive the control signal, and wherein the gain control transistor controls the amount of current flowing through the gain control transistor when the switching transistor is active as a function of the gate-source voltage of the gain control transistor;
   a control signal supplied to each variable gain element, the control signals defining a phase shift; and
   a signal combiner configured to combine an output of each of the plurality of variable gain elements, the signal combiner providing a phase shifted output signal.

2. The phase shifter of claim 1, further comprising a polyphase filter configured to generate the plurality of input signals as quadrature input signals.

3. The phase shifter of claim 1, further comprising a frequency divider configured to generate the plurality of input signals as quadrature input signals.

4. The phase shifter of claim 1, in which each of the variable gain elements provides positive gain.

5. The phase shifter of claim 4, in which each variable gain element further comprises:
   an amplifying transistor;
   an input signal coupled to the amplifying transistor through a capacitor; and
   a gain control signal coupled to the amplifying transistor and configured to adjust the gain of the input signal through the amplifying transistor while preserving amplitude modulation of the input signal.

6. The phase shifter of claim 4, in which each variable gain element is configured to operate on differential input signals.

7. The phase shifter of claim 6, in which each variable gain element further comprises:
   a pair of differential amplifying transistors;
   an input signal coupled to the amplifying transistors through a respective capacitor; and
   a gain control signal coupled to the amplifying transistors and configured to adjust the gain of the input signal through the amplifying transistors while preserving amplitude modulation of the input signal.

8. The phase shifter of claim 1, further comprising a control circuit configured to supply the control signal, the control circuit comprising:
   a plurality of differential pair transistors configured to receive differential components of a control voltage signal (vctrl) and configured to provide differential components of the control signal.

9. The phase shifter of claim 1, wherein each variable gain element is configured to receive one of four quadrature input signals.

10. A method for altering the phase of a signal, comprising:
    providing four quadrature components of a phase signal to a respective plurality of variable gain elements;
    providing a control signal to each of the variable gain elements, each control signal corresponding to a quadrature-phase of the quadrature component provided to the variable gain element;
    altering an amplitude of each quadrature component based on the value of the control signal to cause a phase shift in each quadrature component; and combining each phase shifted quadrature component to provide a phase shifted output signal.

11. The method of claim 10, further comprising generating the quadrature components of the phase signal using a polyphase filter.

12. The method of claim 10, further comprising generating the quadrature components of the phase signal using a frequency divider.

13. The method of claim 10, further comprising controlling a gain of the variable gain amplifier by controlling current flow through a gain control transistor when a switching transistor is active as a function of the gate-source voltage of the gain control transistor.

14. The method of claim 10, further comprising implementing a resistive-capacitive filter at the input of the variable gain element to preserve amplitude modulation at an input to the variable gain amplifier.

15. A portable transceiver having a phase shifter, comprising:
  a transmitter coupled to a receiver;
  a power amplifier associated with the transmitter, the power amplifier having a linear control characteristic, the power amplifier configured to amplify a phase-modulated (PM) signal according to the amplitude of an amplitude-modulated (AM) signal;
  a feedback signal taken from the power amplifier;
  a limiter configured to receive the feedback signal;
  a phase shifter comprising:
    a plurality of variable gain elements, each variable gain element configured to receive one of a plurality of quadrature input signals, each quadrature input signal having a phase that is shifted with respect to each other input signal, wherein each variable gain element comprises a switching transistor and a gain control transistor coupled to the switching transistor, the gain control transistor configured to receive the control signal, and wherein the gain control transistor controls the amount of current flowing through the gain control transistor when the switching transistor is active as a function of the gate-source voltage of the gain control transistor;
    a control signal supplied to each variable gain element, the control signals defining a phase shift; and
    a signal combiner configured to combine an output of each of the plurality of variable gain elements, the signal combiner providing a phase shifted output signal.

16. The portable transceiver of claim 15, in which each of the variable gain elements provides positive gain.

17. The portable transceiver of claim 15, in which each variable gain element further comprises:
  an amplifying transistor:
  an input signal coupled to the amplifying transistor through a capacitor; and
  a gain control signal coupled to the amplifying transistor and configured to adjust the gain of the input signal through the amplifying transistor while preserving amplitude modulation of the input signal.

18. The portable transceiver of claim 17, in which each variable gain element is configured to operate on differential input signals.

19. The portable transceiver of claim 15, further comprising a control circuit configured to supply the control signal, the control circuit comprising:
  a plurality of differential pair transistors configured to receive differential components of a control voltage signal (vctrl) and configured to provide differential components of the control signal.

20. The portable transceiver of claim 15, wherein each variable gain element is configured to receive one of four quadrature input signals.

* * * * *